(12) United States Patent
Kim et al.

(10) Patent No.: US 11,393,854 B2
(45) Date of Patent: Jul. 19, 2022

(54) IMAGE SENSOR WITH PHOTOELECTRIC PART AND TRANSFER GATE ON OPPOSITE SIDES OF THE SUBSTRATE

(71) Applicant: SAMSUNG ELECTRONICS CO., LTD., Suwon-Si (KR)

(72) Inventors: Changhwa Kim, Hwaseong-Si (KR); Kwansik Kim, Seoul (KR); Yoonkyoung Kim, Hwaseong-Si (KR); Sang-Su Park, Seoul (KR); Beomsuk Lee, Yongin-Si (KR); Taeyon Lee, Seoul (KR); Min-Jun Choi, Hwaseong-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 176 days.

(21) Appl. No.: 16/589,488

(22) Filed: Oct. 1, 2019

(65) Prior Publication Data
US 2020/0219914 A1 Jul. 9, 2020

(30) Foreign Application Priority Data
Jan. 7, 2019 (KR) .................. 10-2019-0001937

(51) Int. Cl.
*H01L 27/146* (2006.01)
*H01L 27/148* (2006.01)

(52) U.S. Cl.
CPC .. *H01L 27/14603* (2013.01); *H01L 27/14645* (2013.01); *H01L 27/14812* (2013.01)

(58) Field of Classification Search
CPC ......... H01L 27/14603; H01L 27/14645; H01L 27/14812
See application file for complete search history.

(56) References Cited

U.S. PATENT DOCUMENTS

| | | | |
|---|---|---|---|
| 5,872,029 A | 2/1999 | Gardner et al. |
| 8,836,839 B2 | 9/2014 | Choo et al. |
| 9,443,893 B2 | 9/2016 | Yamazaki |
| 9,564,465 B2 | 2/2017 | Tayanaka |
| 9,748,291 B2 | 8/2017 | Ikeda et al. |
| 9,761,636 B2 | 9/2017 | Lee et al. |

(Continued)

FOREIGN PATENT DOCUMENTS

| | | | | |
|---|---|---|---|---|
| CN | 1926688 A | * | 3/2007 | ........... H04N 5/3559 |
| CN | 110061025 A | * | 7/2019 | |

(Continued)

*Primary Examiner* — Peter Bradford
(74) *Attorney, Agent, or Firm* — Volentine, Whitt & Francos, PLLC

(57) ABSTRACT

An image sensor and a method of fabricating the same, the image sensor including a semiconductor substrate having a first surface and a second surface facing each other; a first photoelectric conversion part disposed on the second surface of the semiconductor substrate; a first floating diffusion region provided in the semiconductor substrate adjacent to the first surface; a first interlayered insulating layer covering the first surface; a first channel pattern on the first interlayered insulating layer; and a first transfer gate electrode disposed adjacent to the first channel pattern and that controls transfer of charge generated in the first photoelectric conversion part to the first floating diffusion region through the first channel pattern.

20 Claims, 30 Drawing Sheets

(56) References Cited

U.S. PATENT DOCUMENTS

| | | |
|---|---|---|
| 10,068,919 B2 | 9/2018 | Yang |
| 2014/0218578 A1 | 8/2014 | Kohyama |
| 2017/0170239 A1* | 6/2017 | Lee ................... H01L 27/14645 |
| 2017/0287958 A1* | 10/2017 | Ohri ..................... H04N 5/3745 |
| 2018/0076252 A1 | 3/2018 | Togashi et al. |
| 2019/0131349 A1* | 5/2019 | Im ...................... H01L 27/14612 |
| 2019/0198555 A1* | 6/2019 | Ahn .................... H01L 27/1464 |
| 2020/0119097 A1* | 4/2020 | Lee ....................... H01L 27/286 |
| 2020/0186732 A1* | 6/2020 | Takizawa ............. H04N 5/3559 |
| 2021/0151487 A1* | 5/2021 | Zang ................. H01L 27/14614 |

FOREIGN PATENT DOCUMENTS

| | | | |
|---|---|---|---|
| KR | 10-1774491 B1 | 9/2017 | |
| WO | WO-2005083790 A1 * | 9/2005 | ....... H01L 27/14609 |
| WO | WO-2017169877 A1 * | 10/2017 | ......... H01L 27/1464 |
| WO | WO-2018180575 A1 * | 10/2018 | ............ H04N 5/369 |
| WO | WO-2020022349 A1 * | 1/2020 | ....... H01L 27/14612 |
| WO | WO-2021100675 A1 * | 5/2021 | ............. H01L 27/06 |

* cited by examiner

IMAGE SENSOR WITH PHOTOELECTRIC PART AND TRANSFER GATE ON OPPOSITE SIDES OF THE SUBSTRATE

CROSS-REFERENCE TO RELATED APPLICATIONS

A claim for priority under 35 U.S.C. § 119 is made to Korean Patent Application No. 10-2019-0001937, filed on Jan. 7, 2019, in the Korean Intellectual Property Office, the entirety of which is hereby incorporated by reference.

BACKGROUND

The inventive concepts relate to image sensors and a method of fabricating the same.

Image sensors are semiconductor devices configured to convert optical images into electrical signals. Image sensors may be classified into two types: charge coupled device (CCD) type and complementary metal-oxide-semiconductor (CMOS) type. In general, a CMOS-type image sensor may be characterized as a "CIS". A CIS includes a plurality of two-dimensionally arranged pixels, each of which includes a photodiode (PD) that coverts incident light into an electrical signal.

SUMMARY

Embodiments of the inventive concepts provide a highly integrated image sensor configured to reduce noise and as having improved image quality.

Embodiments of the inventive concepts provide a method of reducing process failure and contamination issues in a process of fabricating a highly integrated image sensor.

Embodiments of the inventive concepts provide an image sensor including a semiconductor substrate including a first surface, and a second surface opposite to the first surface; a first photoelectric conversion part disposed on the second surface of the semiconductor substrate; a first floating diffusion region provided in the semiconductor substrate adjacent to the first surface; a first interlayered insulating layer covering the first surface; a first channel pattern on the first interlayered insulating layer; and a first transfer gate electrode disposed adjacent to the first channel pattern. The first transfer gate electrode controls transfer of charge generated in the first photoelectric conversion part to the first floating diffusion region through the first channel pattern.

Embodiments of the inventive concepts further provide an image sensor including a semiconductor substrate including a first surface, and a second surface facing the first surface; a photoelectric conversion part disposed on the second surface of the semiconductor substrate; a floating diffusion region disposed in the semiconductor substrate adjacent to the first surface; an interlayered insulating layer covering the first surface and including a recessed region on an upper portion of the interlayered insulating layer; a channel pattern disposed on the interlayered insulating layer and overlapping the recessed region; and a transfer gate electrode disposed in the recessed region. The transfer gate electrode controls transfer of charge generated in the photoelectric conversion part to the floating diffusion region through the channel pattern.

Embodiments of the inventive concepts still further provide an image sensor including a channel pattern disposed on a semiconductor substrate; and a first transfer gate electrode, and a second transfer gate electrode disposed to face the first transfer gate electrode. The channel pattern is interposed between the first and second transfer gate electrodes.

Embodiments of the inventive concepts further provide a method of fabricating an image sensor including preparing a semiconductor substrate including a first surface, and a second surface facing the first surface; forming a floating diffusion region in the semiconductor substrate adjacent to the first surface; forming a first interlayered insulating layer to cover the first surface of the semiconductor substrate; etching the first interlayered insulating layer to form a recessed region, and a contact hole spaced apart from the recessed region, the contact hole exposing the floating diffusion region; forming a transfer gate electrode in the recessed region; forming a contact plug in the contact hole; and forming a channel pattern over the transfer gate electrode and the first interlayered insulating layer.

Embodiments of the inventive concepts also provide an image sensor including a semiconductor substrate including a first surface, and a second surface opposite the first surface; a first photoelectric conversion part disposed on the second surface of the semiconductor substrate, the first photoelectric conversion part configured to generate first charge responsive to first incident light; a first channel pattern disposed over the first surface of the semiconductor substrate; and a first transfer gate electrode disposed adjacent the first channel pattern and configured to control transfer of the first charge from the first photoelectric conversion part through the first channel pattern.

BRIEF DESCRIPTION OF THE DRAWINGS

The forgoing and other features of the inventive concepts will be described hereinafter in more detail with reference to the accompanying drawings.

DETAILED DESCRIPTION

Example embodiments of the inventive concepts will now be described more fully with reference to the accompanying drawings.

It should be understood that the accompanying figures are intended to illustrate general characteristics of methods, structure and/or materials utilized in certain example embodiments and to supplement the written description hereinafter provided. These drawings are not however to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Figure 1:
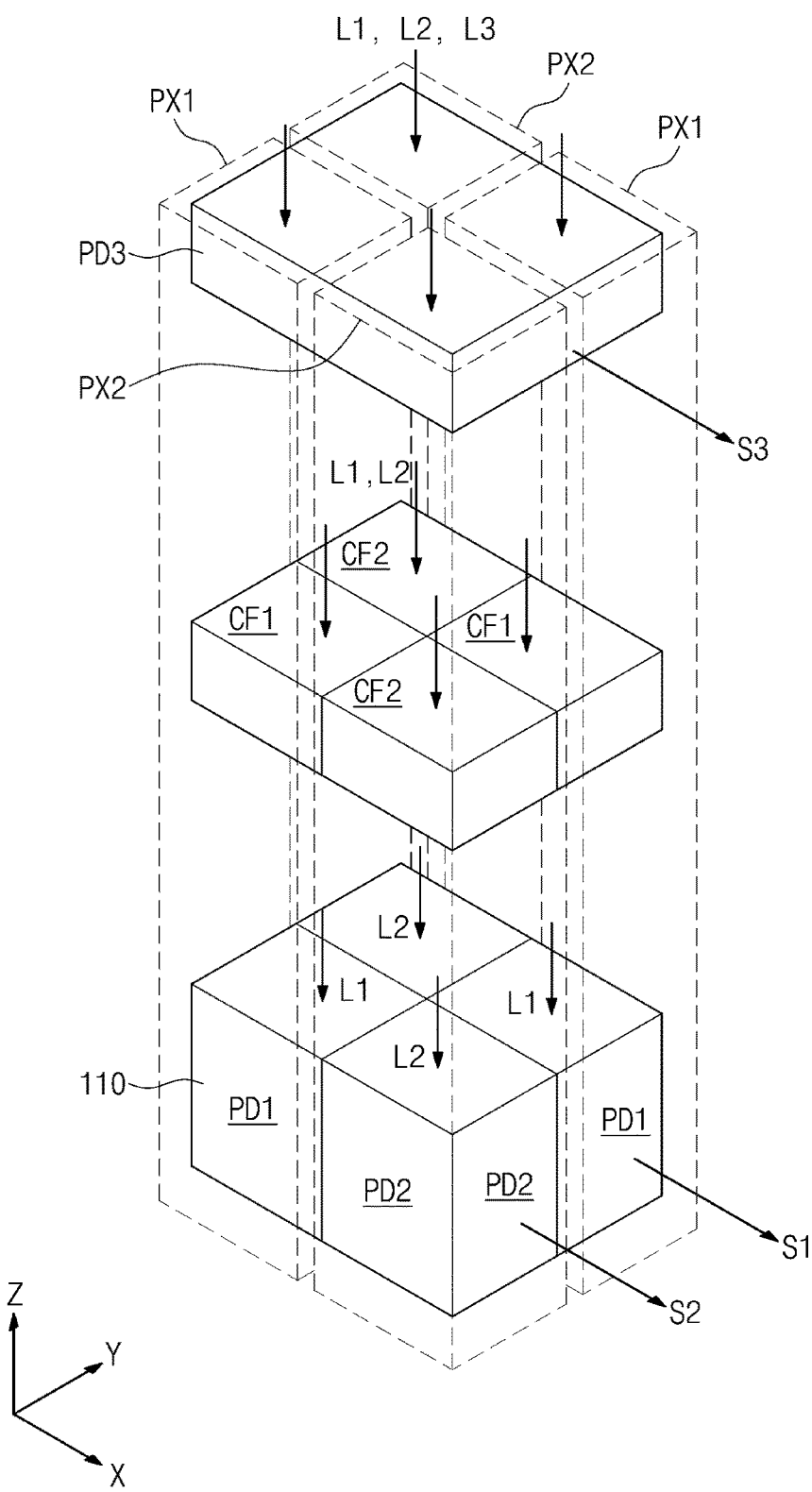
FIG. 1 illustrates a block diagram of an image sensor according to embodiments of the inventive concepts.

FIG. 1 illustrates a block diagram of an image sensor according to embodiments of the inventive concepts.

Referring to FIG. 1, an image sensor includes first to third photoelectric conversion parts PD1, PD2, and PD3 and first and second color filters CF1 and CF2. The first and second photoelectric conversion parts PD1 and PD2 may be provided in a semiconductor substrate 110. The third photoelectric conversion part PD3 may be provided on a surface of the semiconductor substrate 110, and the first and second color filters CF1 and CF2 may be provided between the third photoelectric conversion part PD3 and the semiconductor substrate 110.

Light L1, L2, and L3 of first to third wavelengths are incident onto the third photoelectric conversion part PD3. The first wavelength and the second wavelength may differ from the third wavelength. The first wavelength may differ from the second wavelength. For example, the light L1 of the first wavelength may correspond to a red color light, the light L2 of the second wavelength may correspond to a blue color light, and the light L3 of the third wavelength may correspond to a green color light.

The third photoelectric conversion part PD3 generates a third photoelectric signal S3 from the light L3 of the third wavelength. The third photoelectric conversion part PD3 is configured to allow the light L1 and L2 of the first and second wavelengths to pass therethrough. The third photoelectric conversion part PD3 may be shared by a plurality of first and second pixels PX1 and PX2.

The light L1 and L2 passing through the third photoelectric conversion part PD3 are incident into the first and second color filters CF1 and CF2. The first pixels PX1 include the first color filter CF1 and the first photoelectric conversion part PD1. The second pixels PX2 include the second color filter CF2 and the second photoelectric conversion part PD2. The first photoelectric conversion part PD1 may be provided below the first color filter CF1, and the second photoelectric conversion part PD2 may be provided below the second color filter CF2.

The light L1 of the first wavelength passes through the first color filter CF1 but does not pass through the second color filter CF2. The light L2 of the second wavelength passes through the second color filter CF2 but does not pass through the first color filter CF1. The light L1 of the first wavelength passing through the first color filter CF1 is incident onto the first photoelectric conversion part PD1. The first photoelectric conversion part PD1 generates a first photoelectric signal S1 from the light L1 of the first wavelength. The light L2 of the second wavelength passing through the second color filter CF2 is incident onto the second photoelectric conversion part PD2. The second photoelectric conversion part PD2 generates a second photoelectric signal S2 from the light L2 of the second wavelength.

According to embodiments of the inventive concepts, the third photoelectric conversion part PD3 is disposed on the first and second photoelectric conversion parts PD1 and PD2, and this makes it possible to increase integration density of the image sensor.

Figure 2:
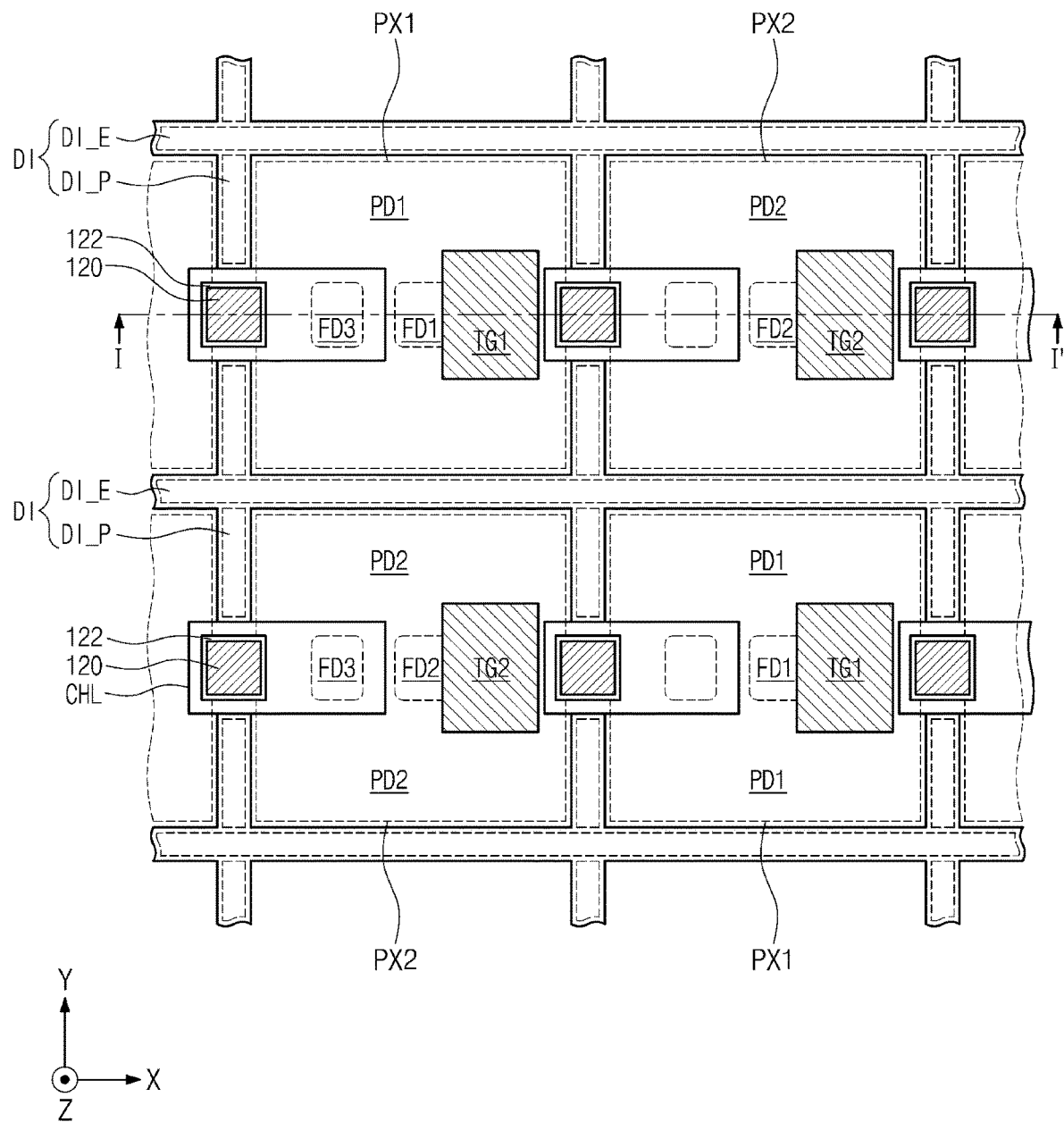
FIG. 2 illustrates a plan view of an image sensor according to embodiments of the inventive concepts.
Figure 3:
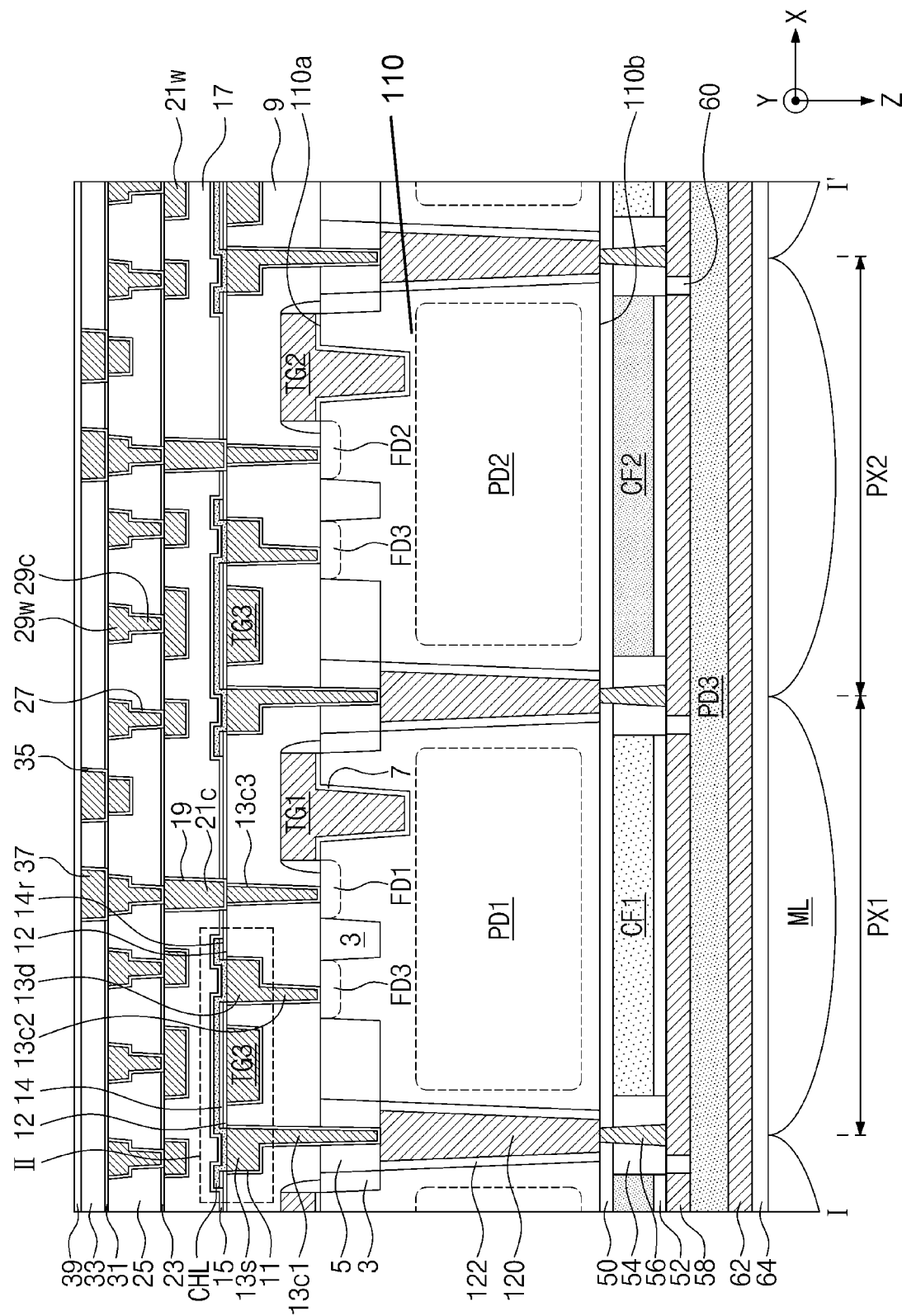
FIG. 3 illustrates a sectional view taken along a line I-I' of the image sensor of FIG. 2 according to embodiments of the inventive concepts.
Figure 4:
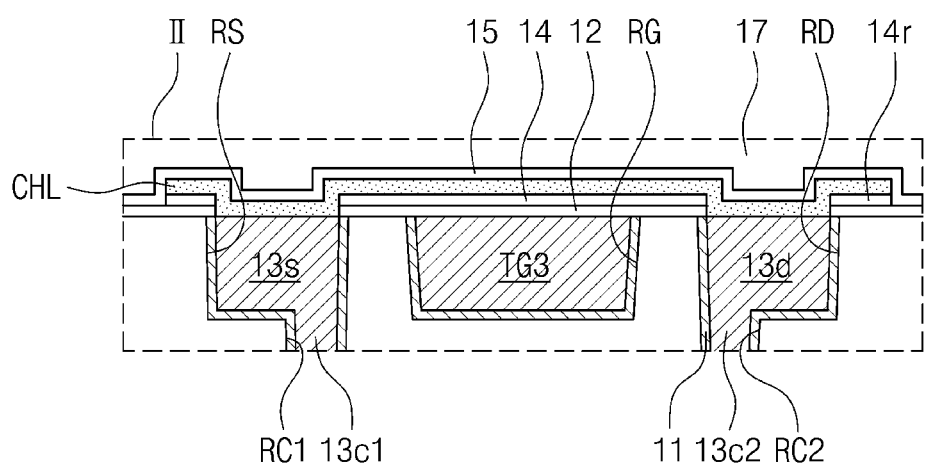
FIG. 4 illustrates an enlarged sectional view of a portion 'II' of FIG. 3.

FIG. 2 illustrates a plan view of an image sensor according to embodiments of the inventive concepts. FIG. 3 illustrates a sectional view taken along a line I-I' of the image sensor of FIG. 2 according to embodiments of the inventive concepts. FIG. 4 illustrates an enlarged sectional view of a portion 'II' of FIG. 3.

Referring to FIGS. 2 to 4, the semiconductor substrate 110 includes first pixels PX1 and second pixels PX2. The semiconductor substrate 110 may be a single crystalline silicon wafer or an epitaxial silicon layer. The semiconductor substrate 110 may be doped with impurities of a first conductivity type. For example, the first conductivity type may be P type. The impurities of the first conductivity type may be, for example, boron. The semiconductor substrate 110 may include a first surface 110a and a second surface 110b facing each other. The first surface 110a may be a front surface, on which transistors are disposed. The second surface 110b may be a rear surface, to which light is incident. In an embodiment, the image sensor may be a back-side illuminated image sensor.

A deep device isolation part DI is disposed in the semiconductor substrate 110 to separate the first pixels PX1 and the second pixels PX2 from each other. The deep device isolation part DI may include an extended portion DI_E which extends in a first direction X, and protruding portions DI_P which protrude from the extended portion DI_E in a second direction Y crossing the first direction X or in a direction opposite to the second direction Y. The deep device isolation part DI may be formed of or include at least one of, for example, silicon oxide, metal oxides (e.g., hafnium oxide and aluminum oxide), or poly silicon or the like.

When viewed in a plan view, a through electrode 120 is disposed between the protruding portions DI_P, which are adjacent to each other in the second direction Y, of the deep device isolation part DI. The through electrode 120 may include for example doped polysilicon or conductive materials (e.g., tungsten). A via insulating layer 122 may be interposed between the through electrode 120 and the semiconductor substrate 110. The via insulating layer 122 may be formed of or include at least one of, for example, silicon oxide, silicon nitride, or silicon oxynitride or the like and may have a single- or multi-layered structure.

A shallow device isolation part 3 is disposed in the first surface 110a of the semiconductor substrate 110 to define active regions of the first and second pixels PX1 and PX2. The shallow device isolation part 3 may be formed of or include at least one of, for example, silicon oxide, silicon nitride, or silicon oxynitride or the like.

Top surfaces of the through electrode 120 and the via insulating layer 122 may be located at a level equal to or lower than a bottom surface of the shallow device isolation part 3. An insulating gapfill layer 5 may be disposed on the through electrode 120 and the via insulating layer 122. The insulating gapfill layer 5 may be formed of or include at least one of, for example, silicon oxide, silicon nitride, or silicon oxynitride or the like. Bottom surfaces of the through electrode 120 and the via insulating layer 122 may be substantially coplanar with the second surface 110b of the semiconductor substrate 110.

In the first pixel PX1, the first photoelectric conversion part PD1 is disposed in the semiconductor substrate 110. In the second pixel PX2, the second photoelectric conversion part PD2 is disposed in the semiconductor substrate 110. The first and second photoelectric conversion parts PD1 and PD2 may be impurity regions doped to have a second conductivity type different from the first conductivity type. For example, the second conductivity type may be an N type, and the impurity of the second conductivity type may be phosphorus or arsenic. The first and second photoelectric conversion parts PD1 and PD2 and the semiconductor substrate 110 adjacent thereto constitute PN junctions, serving as photodiodes.

In the first pixel PX1, a first transfer gate electrode TG1 is disposed on the first surface 110a of the semiconductor substrate 110. In the second pixel PX2, a second transfer gate electrode TG2 is disposed on the first surface 110a of the semiconductor substrate 110. A first gate insulating layer 7 is interposed between the first transfer gate electrode TG1 and the semiconductor substrate 110 and between the second transfer gate electrode TG2 and the semiconductor substrate 110. The first gate insulating layer 7 may include, for example, a silicon oxide layer.

In the first pixel PX1, a first floating diffusion region FD1 is disposed in the semiconductor substrate 110 adjacent to the first transfer gate electrode TG1. A third floating diffusion region FD3 is disposed in a region of the semiconductor substrate 110 adjacent to the first surface 110a. The third floating diffusion region FD3 is spaced apart from the first floating diffusion region FD1 by the shallow device isolation part 3. In the second pixel PX2, a second floating diffusion region FD2 is disposed in the semiconductor substrate 110 adjacent to the second transfer gate electrode TG2. The third floating diffusion region FD3 is disposed in a region of the semiconductor substrate 110 adjacent to the first surface 110a. The third floating diffusion region FD3 is spaced apart from the second floating diffusion region FD2 by the shallow device isolation part 3. The first to third floating diffusion regions FD1, FD2, and FD3 may be impurity regions, which are doped with the impurity of the second conductivity type.

The first surface 110a of the semiconductor substrate 110 is covered with a first interlayered insulating layer 9. The first interlayered insulating layer 9 may be formed of or include at least one of, for example, silicon oxide, silicon nitride, silicon oxynitride, or porous oxide materials or the like. First to third recess regions RS, RG, and RD, which are spaced apart from each other, are formed in an upper portion of the first interlayered insulating layer 9. A first contact hole RC1 is formed through a bottom of the first recess region RS, and a second contact hole RC2 is formed through a bottom of the third recess region RD. A source electrode 13s is disposed in the first recess region RS. A third transfer gate electrode TG3 is disposed in the second recess region RG. A drain electrode 13d is disposed in the third recess region RD. A first-level first contact plug 13c1 is disposed in the first contact hole RC1 to electrically connect the source electrode 13s to the through electrode 120. The first-level first contact plug 13c1 may be extended into the insulating gapfill layer 5 and may be located adjacent to the through electrode 120. A first-level second contact plug 13c2 is disposed in the second contact hole RC2 to electrically connect the drain electrode 13d to the third floating diffusion region FD3. A first-level third contact plug 13c3, which is spaced apart from the first-level second contact plug 13c2 and is electrically connected to the first or second floating diffusion regions FD1 or FD2, is disposed in the first interlayered insulating layer 9. The first-level contact plugs 13c1, 13c2, and 13c3, the source electrode 13s, the drain electrode 13d, and the third transfer gate electrode TG3 may be formed of or include the same conductive material (e.g., tungsten). A first diffusion barrier layer 11 is provided to cover side and bottom surfaces of the first-level contact plugs 13c1, 13c2, and 13c3, the source electrode 13s, the drain electrode 13d, and the third transfer gate electrode TG3. The first diffusion barrier layer 11 may include, for example, a titanium nitride layer. Top surfaces of the third contact plug 13c3, the source electrode 13s, the drain electrode 13d, and the third transfer gate electrode TG3 may be substantially coplanar with a top surface of the first interlayered insulating layer 9.

A first etch stop layer 12 is disposed on the first interlayered insulating layer 9. The first etch stop layer 12 may be formed of an insulating layer having an etch selectivity with respect to the first interlayered insulating layer 9. For example, the first etch stop layer 12 may be formed of a silicon nitride layer.

A second gate insulating layer 14 is disposed on (over) the third transfer gate electrode TG3. The second gate insulating layer 14 may be formed of or include at least one of, for example, silicon oxide or metal oxide materials (e.g., aluminum oxide) having a dielectric constant higher than silicon oxide. A portion of the first etch stop layer 12 may be interposed between the second gate insulating layer 14 and the third transfer gate electrode TG3 and may be used as an additional gate insulating layer.

A channel pattern CHL is disposed on the second gate insulating layer 14. In an embodiment, the channel pattern CHL may be formed of or include at least one of oxide semiconductor materials. For example, the channel pattern CHL may include an oxide semiconductor material containing at least one of indium (In), gallium (Ga), zinc (Zn), or tin (Sn). As an example, the oxide semiconductor material may be indium-gallium-zinc-oxide (IGZO) containing indium (In), gallium (Ga) and zinc (Zn). In certain embodiments, the oxide semiconductor material may be an amorphous IGZO.

Figure 5A:
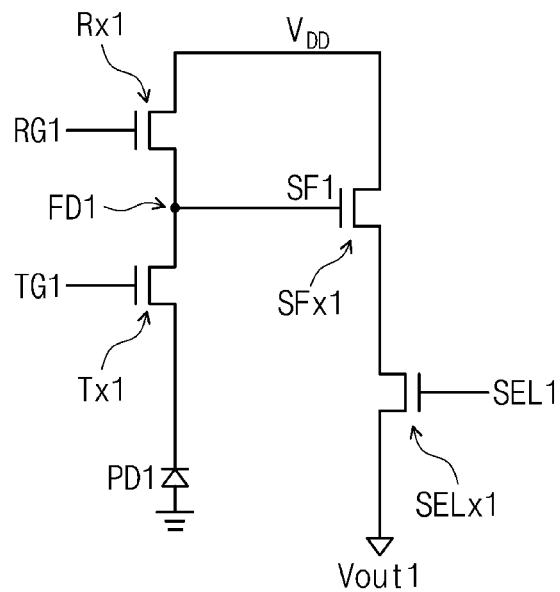
FIG. 5A illustrates a circuit diagram of an image sensor according to embodiments of the inventive concepts.
Figure 5B:
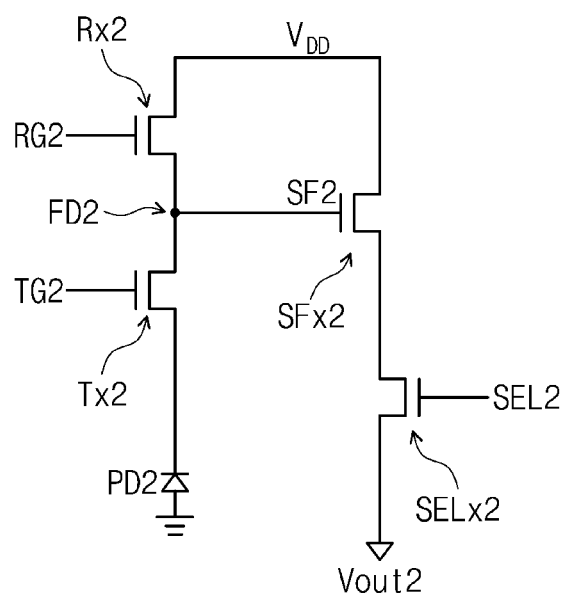
FIG. 5B illustrates a circuit diagram of an image sensor according to embodiments of the inventive concepts.
Figure 5C:
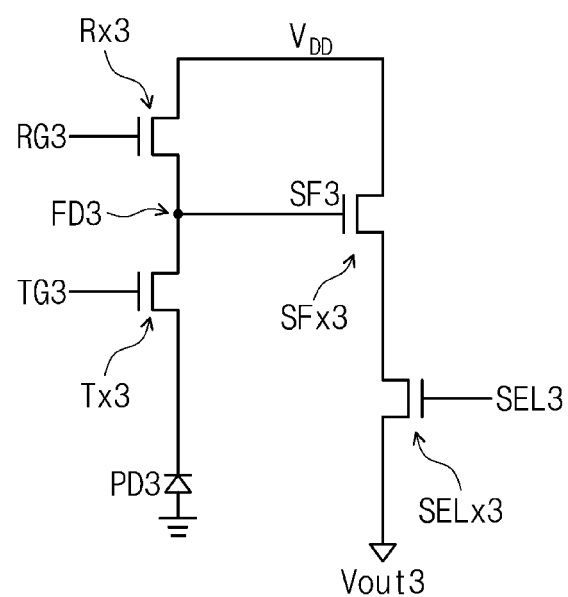
FIG. 5C illustrates a circuit diagram of an image sensor according to embodiments of the inventive concepts.

The third transfer gate electrode TG3, the source electrode 13s, the drain electrode 13d, the second gate insulating layer 14, and the channel pattern CHL may constitute a third transfer transistor Tx3 of FIG. 5C.

The channel pattern CHL may be extended beyond the opposite sides of the third transfer gate electrode TG3 and may include portions, which are located on the source electrode 13s and the drain electrode 13d. The channel pattern CHL may penetrate the second gate insulating layer 14 and the first etch stop layer 12 and may be in contact with the source electrode 13s and the drain electrode 13d. In an embodiment, the channel pattern CHL may be laterally further extended beyond the source electrode 13s and the drain electrode 13d. A remaining gate insulating layer 14r may be interposed between the channel pattern CHL and the first interlayered insulating layer 9.

The first etch stop layer 12 may be partially exposed at a region outside the channel pattern CHL. A side surface of the channel pattern CHL may be aligned to a side surface of the remaining gate insulating layer 14r. The channel pattern CHL and the first etch stop layer 12 are covered with a second etch stop layer 15. A second interlayered insulating layer 17 is disposed on the second etch stop layer 15. Second-level lines 21w and second-level contact plugs 21c are disposed in the second interlayered insulating layer 17. Side and bottom surfaces of the second-level lines 21w and the second-level contact plugs 21c are covered with a second diffusion barrier layer 19. The second-level lines 21w and the second-level contact plugs 21c may contain a metallic material that is different from that of the source electrode 13s, the third transfer gate electrode TG3, and the drain electrode 13d. In an embodiment, the second-level lines 21w and the second-level contact plugs 21c may contain copper.

A third etch stop layer 23 and a third interlayered insulating layer 25 are sequentially formed on the second interlayered insulating layer 17. Third-level lines 29w and third-level contact plugs 29c are disposed in the third interlayered insulating layer 25. Side and bottom surfaces of the third-level lines 29w and the third-level contact plugs 29c are covered with a third diffusion barrier layer 27. A fourth etch stop layer 31 and a fourth interlayered insulating layer 33 are sequentially stacked on the third interlayered insulating layer 25. Fourth-level lines 37 and a fourth diffusion barrier layer 35 are disposed in the fourth interlayered insulating layer 33, the fourth diffusion barrier layer 35 provided to cover side and bottom surfaces of the fourth-level lines 37. The fourth interlayered insulating layer 33 is covered with a first passivation layer 39. The third and fourth etch stop layers 23 and 31 may include, for example, a silicon nitride layer. The third and fourth interlayered insulating layers 25 and 33 may include, for example, a silicon oxide layer or a porous insulating layer. The third-level lines 29w, the third-level contact plugs 29c, and the fourth-level lines 37 may include, for example, copper. The third and fourth diffusion barrier layers 27 and 35 may include, for example, a metal nitride layer (e.g., a titanium nitride layer). The first passivation layer 39 may include, for example, a silicon nitride layer or a polyimide layer.

A protection layer 50 is disposed on the second surface 110b of the semiconductor substrate 110. The protection layer 50 may include an insulating layer (e.g., a silicon oxide layer). In an embodiment, the protection layer 50 may be in contact with the second surface 110b and may have negative fixed charges. The protection layer 50 may be formed of metal oxide or metal fluoride containing at least one metallic element selected from the group consisting of hafnium (Hf), zirconium (Zr), aluminum (Al), tantalum (Ta), titanium (Ti), yttrium (Y), and lanthanoid. For example, the protection layer 50 may be formed of or include hafnium oxide or aluminum oxide. This may lead to hole accumulation near the protection layer 50. Accordingly, it may be possible to effectively reduce or suppress a dark current issue and a white spot issue. In an embodiment, the protection layer 50 may be formed of an insulating layer having a good step coverage property. The protection layer 50 may serve as a planarization layer.

In the first pixel PX1, the first color filter CF1 is disposed on the protection layer 50. In the second pixel PX2, the second color filter CF2 is disposed on the protection layer 50. The first color filter CF1 and the second color filter CF2 may include pigments or dyes of different colors. A first insulating pattern 54 is interposed between the first and second color filters CF1 and CF2. In an embodiment, the first insulating pattern 54 may be formed of or include a material, whose refractive index is lower than those of the first and second color filters CF1 and CF2. In this case, it may be possible to increase an amount of light to be incident into the pixels PX1 and PX2 and to improve light sensitivity of the pixels PX1 and PX2.

Pixel electrodes 58 are disposed on the first and second color filters CF1 and CF2, respectively. A second insulating pattern 52 is interposed between the pixel electrode 58 and each of the first and second color filters CF1 and CF2. The second insulating pattern 52 may be formed of or include at least one of insulating materials (e.g., silicon oxide or silicon nitride). The pixel electrode 58 is disposed on the second insulating pattern 52. The pixel electrode 58 may include indium-tin oxide (ITO), indium-zinc oxide (IZO), zinc oxide (ZnO), and/or organic transparent conductive materials. The pixel electrode 58 is electrically connected to the through electrode 120 through a via plug 56 penetrating the first insulating pattern 54. A third insulating pattern 60 is interposed between the pixel electrodes 58.

The third photoelectric conversion part PD3 is disposed on the pixel electrodes 58. The third photoelectric conversion part PD3 may be, for example, an organic photoelectric conversion layer. The third photoelectric conversion part PD3 may include a P-type organic semiconductor material and an N-type organic semiconductor material, and the P-type organic semiconductor material and the N-type organic semiconductor material may constitute a PN junction. In an embodiment, the third photoelectric conversion part PD3 may be formed of or include at least one of quantum dots or chalcogenide materials.

A common electrode 62 is disposed on the third photoelectric conversion part PD3. The common electrode 62 may include indium-tin oxide (ITO), indium-zinc oxide (IZO), zinc oxide (ZnO), and/or organic transparent conductive materials. The pixel electrodes 58 are respectively provided in every pixel, whereas the third photoelectric conversion part PD3 and the common electrode 62 are not separated and are thus provided at substantially all of the second surface 110b of the semiconductor substrate 110. A second passivation layer 64 is disposed on the common electrode 62. A micro lens ML is disposed on the second passivation layer 64.

FIGS. 5A to 5C illustrate circuit diagrams of image sensors according to embodiments of the inventive concepts.

Referring to FIGS. 1 to 4 and FIGS. 5A to 5C, a first transfer transistor Tx1 including the first transfer gate electrode TG1 and the first floating diffusion region FD1 is disposed in the first pixel PX1 as shown in FIG. 5A. Although not shown in FIGS. 1 to 4, a first reset transistor Rx1 including the first reset gate electrode RG1, a first source follower transistor SFx1 including the first source follower gate electrode SF1, and a first selection transistor SELx1 including the first selection gate electrode SEL1 are disposed in the first pixel PX1. A second transfer transistor Tx2 including the second transfer gate electrode TG2 and the second floating diffusion region FD2 are disposed in the second pixel PX2 as shown in FIG. 5B. Although not shown in FIGS. 1 to 4, a second reset transistor Rx2 including the second reset gate electrode RG2, a second source follower transistor SFx2 including the second source follower gate electrode SF2, and a second selection transistor SELx2 including the second selection gate electrode SEL2 are disposed in the second pixel PX2. The third transfer transistor Tx3 including the third transfer gate electrode TG3 and the third floating diffusion region FD3 is disposed in each of the first pixel PX1 and the second pixel PX2.

Although not shown in FIGS. 1 to 4, a third reset transistor Rx3 including the third reset gate electrode RG3, a third source follower transistor SFx3 including the third source follower gate electrode SF3, and a third selection transistor SELx3 including the third selection gate electrode SEL3 are disposed in the first pixel PX1 or the second pixel PX2. The first pixel PX1 and the second pixel PX2 may share the first to third reset transistors Rx1, Rx2, and Rx3. For example, one reset transistor may be electrically connected to the first to third transfer transistors Tx1, Tx2, and Tx3 and may serve as the first to third reset transistors Rx1, Rx2, and Rx3. Similarly, the first pixel PX1 and the second pixel PX2 may share the first to third source follower transistors SFx1, SFx2, and SFx3 and the first to third selection transistors SELx1, SELx2, and SELx3.

Color information obtained by the first photoelectric conversion part PD1 may be output as a first signal Vout1 through the first transfer transistor Tx1, the first reset transistor Rx1, the first source follower transistor SFx1, and the first selection transistor SELx1. Color information obtained by the second photoelectric conversion part PD2 may be output as a second signal Vout2 through the second transfer transistor Tx2, the second reset transistor Rx2, the second source follower transistor SFx2, and the second selection transistor SELx2. Color information obtained by the third photoelectric conversion part PD3 may be output as a third signal Vout3 through the third transfer transistor Tx3, the third reset transistor Rx3, the third source follower transistor SFx3, and the third selection transistor SELx3.

According to the afore-described embodiments of the inventive concepts, the image sensor may include the third transfer transistor Tx3, which is used to transfer charges generated in the third photoelectric conversion part PD3. That is, the image sensor may include a 4-transistor CDS (Correlated Double sampling) circuit including four transistors, which are used to transfer each color information. This may make it possible to reduce a reset noise. In addition, the third transfer transistor Tx3 may be used to more quickly transfer charges, which are generated in the third photoelectric conversion part PD3, to the third floating diffusion region FD3. Thus, it may be possible to provide a highly integrated image sensor capable of realizing improved image quality.

FIGS. 6A to 6E illustrate sectional views sequentially showing a process of fabricating an image sensor having the vertical section of FIG. 3.

Figure 6A:
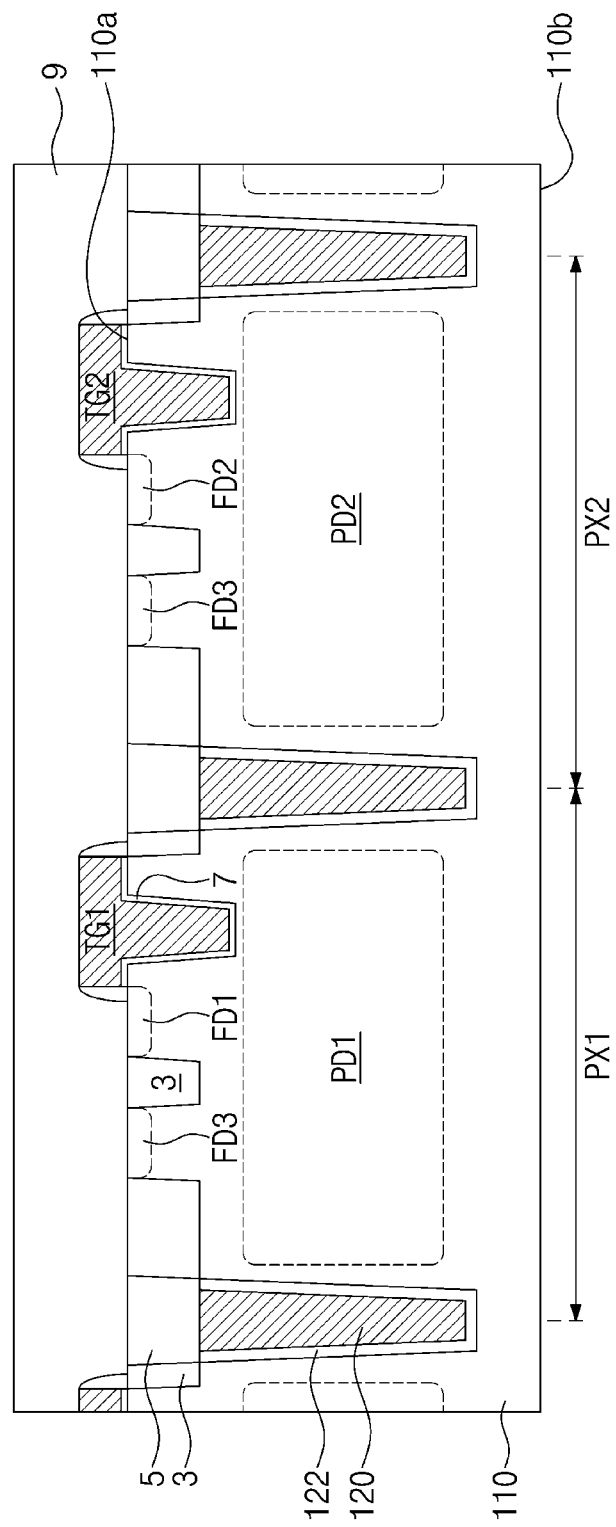
FIGS. 6A, 6B, 6C, 6D and 6E illustrate sectional views sequentially showing a process of fabricating an image sensor having the vertical section of FIG. 3.

Referring to FIG. 6A, the semiconductor substrate 110 including the first pixel PX1 and the second pixel PX2 are prepared. The semiconductor substrate 110 may be doped with impurities of a first conductivity type. The first photoelectric conversion part PD1 and the second photoelectric conversion part PD2 may be formed in the semiconductor substrate 110 by performing an ion implantation process several times and performing a thermal treatment process. The first and second photoelectric conversion parts PD1 and PD2 may be doped to have a second conductivity type different from the first conductivity type. A shallow trench isolation (STI) process may be performed to form the shallow device isolation part 3 in the semiconductor substrate 110 and near the first surface 110a. The deep device isolation part DI may be formed between the pixels PX1 and PX2 by patterning the shallow device isolation part 3 and the semiconductor substrate 110 thereunder to form a deep trench, sequentially forming an insulating layer and a poly-silicon layer to fill the deep trench, and then, performing a polishing or etch-back process on the insulating layer and the poly-silicon layer.

The protruding portion DI_P of the deep device isolation part DI may be partially removed to form a penetration via hole, the via insulating layer 122 and a conductive layer may be formed to fill the penetration via hole, and then, a polishing or etch-back process may be performed to form the through electrode 120 in the penetration via hole. An upper portion of the through electrode 120 may be recessed, and the insulating gapfill layer 5 may be formed to fill the recessed portion. In the first and second pixels PX1 and PX2, the first gate insulating layer 7 and the first and second transfer gate electrodes TG1 and TG2 may be formed on the first surface 110a of the semiconductor substrate 110. Each of the first and second transfer gate electrodes TG1 and TG2 may be formed to have a portion extended into the semiconductor substrate 110. An ion implantation process may be performed to form the first and second floating diffusion regions FD1 and FD2 in portions of the semiconductor substrate 110 around the first and second transfer gate electrodes TG1 and TG2. Here, the third floating diffusion region FD3 may be formed in a region of the semiconductor substrate 110 delimited by the shallow device isolation part 3. The first interlayered insulating layer 9 may be formed to cover the first surface 110a of the semiconductor substrate 110.

Figure 6B:
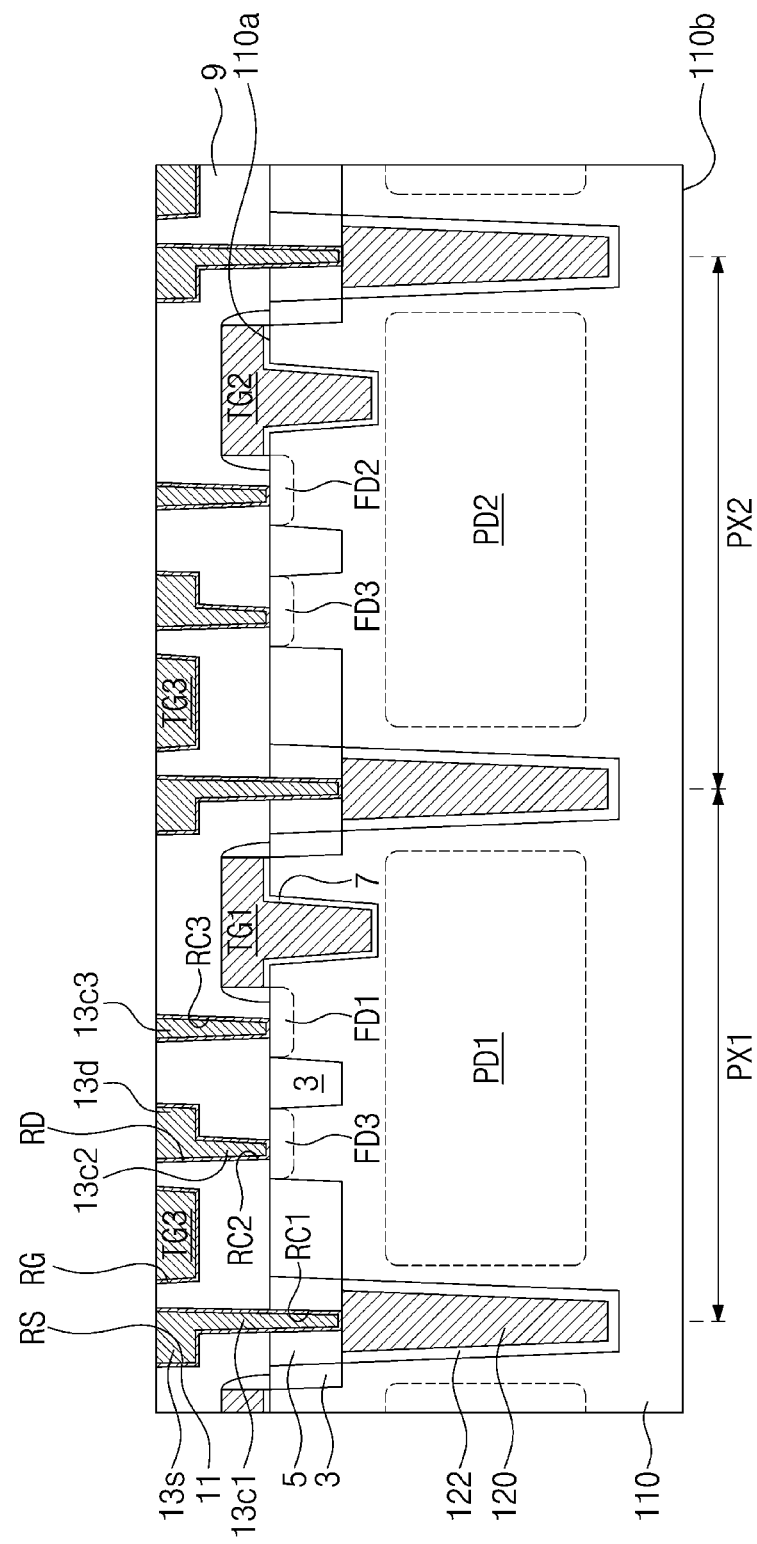

Referring to FIG. 6B, the first interlayered insulating layer 9 may be etched to form the first to third recess regions RS, RG, and RD and the first to third contact holes RC1, RC2, and RC3. The first recess region RS and the first contact hole RC1 may be formed to have a dual damascene hole structure, and the third recess region RD and the second contact hole RC2 may be formed to have the dual damascene hole structure. During the formation of the first contact hole RC1, a portion of the insulating gapfill layer 5 may be etched to expose a portion of a top surface of the through electrode 120. The second contact hole RC2 may be formed to expose the third floating diffusion region FD3. The third contact holes RC3 may be formed to expose the first and second floating diffusion regions FD1 and FD2. The first diffusion barrier layer 11 and a conductive layer (e.g., tungsten) may be sequentially formed on the first interlayered insulating layer 9 to fill the first to third recess regions RS, RG, and RD and the first to third contact holes RC1, RC2, and RC3, and then, a polishing or etch-back process may be performed to form the source electrode 13s, the third transfer gate electrode TG3, the drain electrode 13d, and the first-level contact plugs 13c1, 13c2, and 13c2.

Figure 6C:
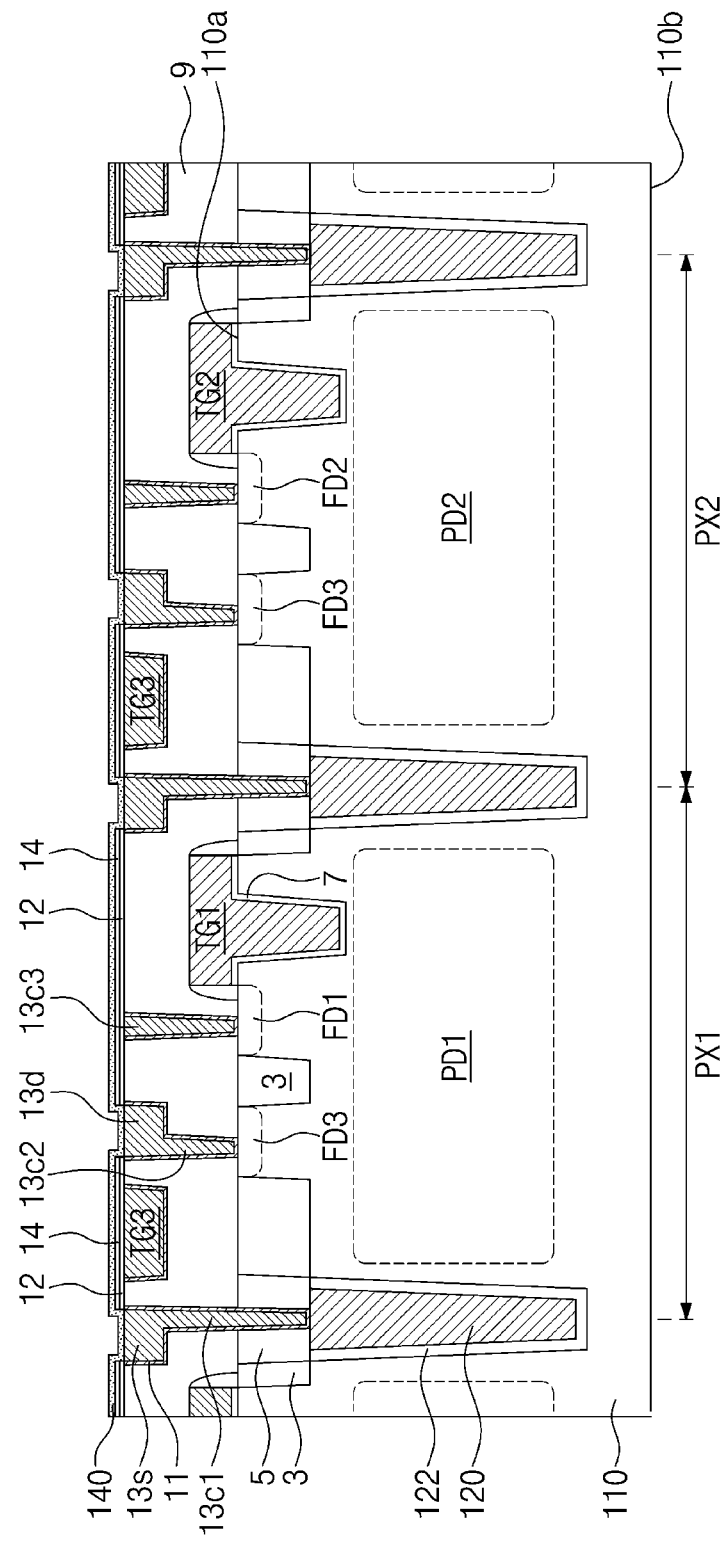

Referring to FIG. 6C, the first etch stop layer 12 and the second gate insulating layer 14 may be sequentially formed on the first interlayered insulating layer 9. The first etch stop layer 12 may be formed of or include, for example, silicon nitride. The second gate insulating layer 14 may be formed of or include, for example, aluminum oxide or silicon oxide. The second gate insulating layer 14 and the first etch stop layer 12 may be etched to expose top surfaces of the source and drain electrodes 13s and 13d. A channel layer 140 may be formed on the second gate insulating layer 14. The channel layer 140 may be formed of an oxide semiconductor material (e.g., IGZO). The channel layer 140 may be formed to be in contact with the source electrode 13s and the drain electrode 13d.

Figure 6D:
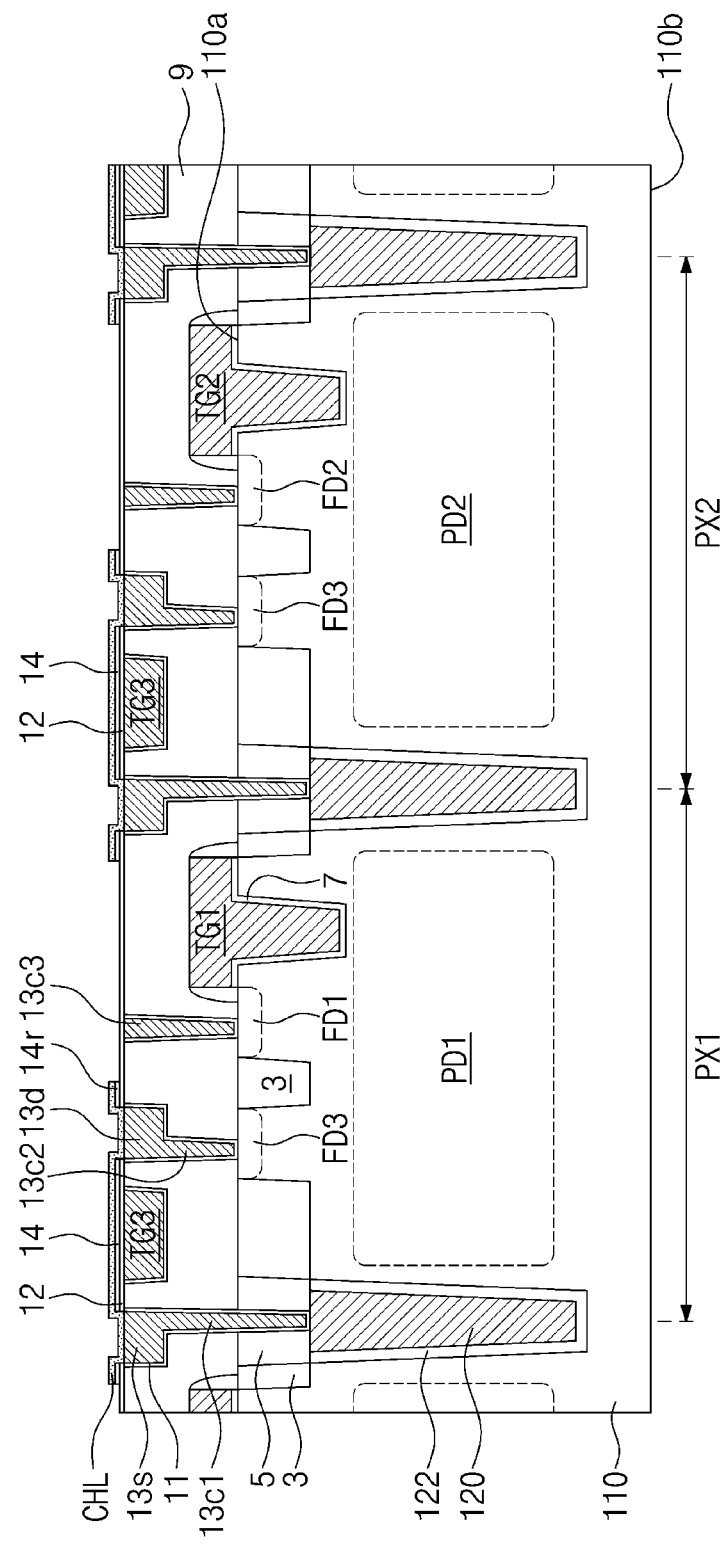

Referring to FIG. 6D, the channel layer 140 and the second gate insulating layer 14 may be patterned to expose portions of the first etch stop layer 12 around the source electrode 13s and the drain electrode 13d, and thus, the channel pattern CHL may be formed. At this time, the remaining gate insulating layer 14r is thus formed.

Figure 6E:
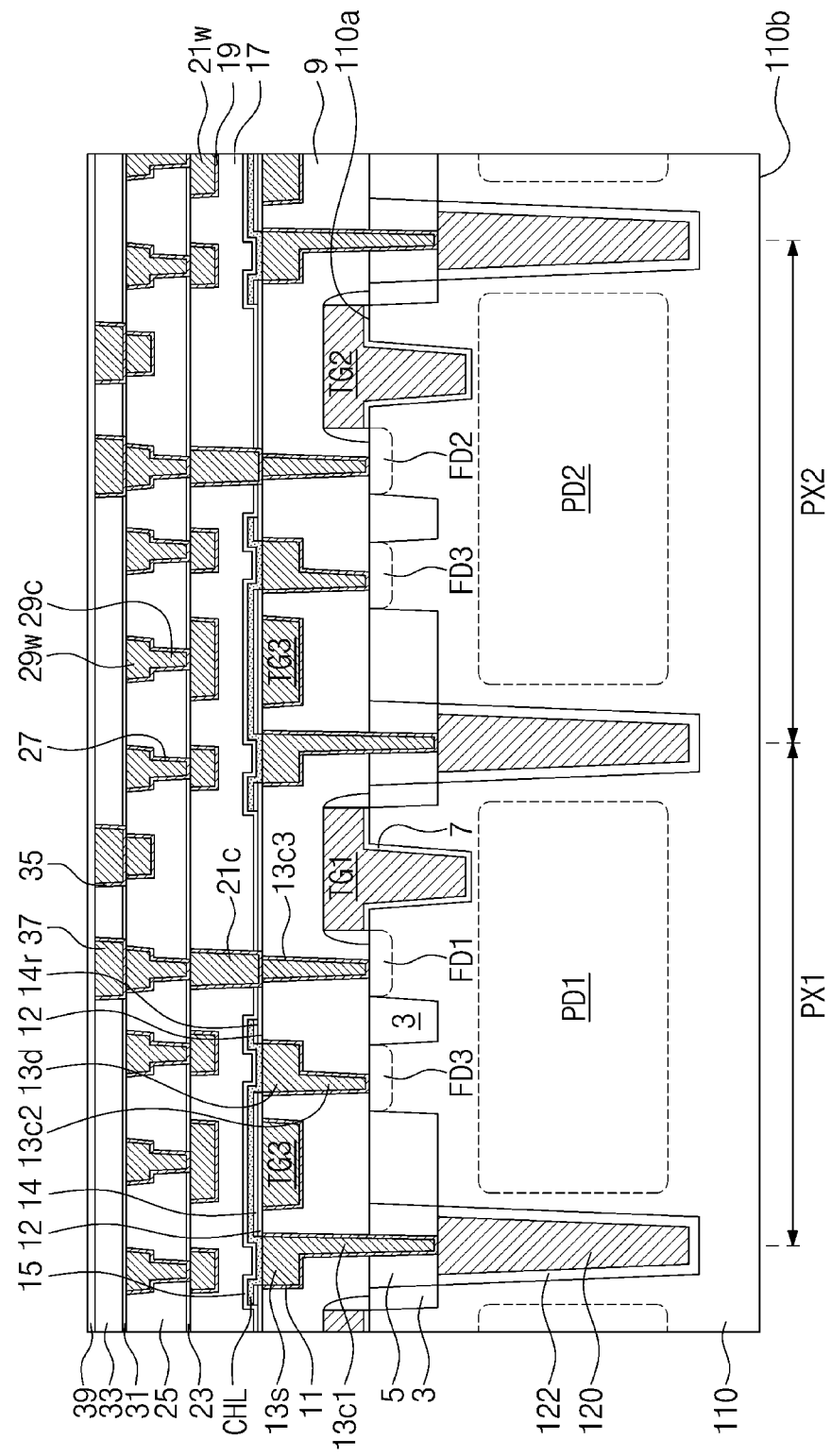

Referring to FIG. 6E, the second etch stop layer 15 may be conformally formed on the first surface 110a of the semiconductor substrate 110 provided with the channel pattern CHL. Thereafter, the second to fourth interlayered insulating layers 17, 25, 33, the third and fourth etch stop layers 23 and 31, the second-level lines 21w, the second-level contact plugs 21c, the third-level lines 29w, the third-level contact plugs 29c, the fourth-level lines 37, and the first passivation layer 39 may be formed through a conventional back-end-of-line (BEOL) process.

Next, referring to FIGS. 6E and 3, a grinding process may be performed on the second surface 110b of the semiconductor substrate 110 to remove a portion of the semiconductor substrate 110 and to expose the through electrode 120. The color filters CF1 and CF2, the pixel electrodes 58, the third photoelectric conversion part PD3, the common electrode 62, and the micro lens ML may be formed on the second surface 110b of the semiconductor substrate 110.

In a method of fabricating an image sensor according to embodiments of the inventive concepts, the channel pattern CHL, which is made of an oxide semiconductor material, may be formed before the BEOL process. Most interconnection lines in the BEOL process may be formed of copper, and thus, in the BEOL process, it is important to prevent an apparatus from being contaminated by copper. In the case where an oxide semiconductor material such as IGZO is used in the BEOL process, an apparatus may be contaminated by the IGZO, and in certain cases, it may be necessary to change a process sequence in the conventional BEOL process and consequently to increase complexity of the process. In contrast, in the method of fabricating an image sensor according to embodiments of the inventive concepts, since the channel pattern CHL made of an oxide semiconductor material is formed before the BEOL process, it may be possible to avoid these issues and to reduce or suppress process failure.

Figure 7:
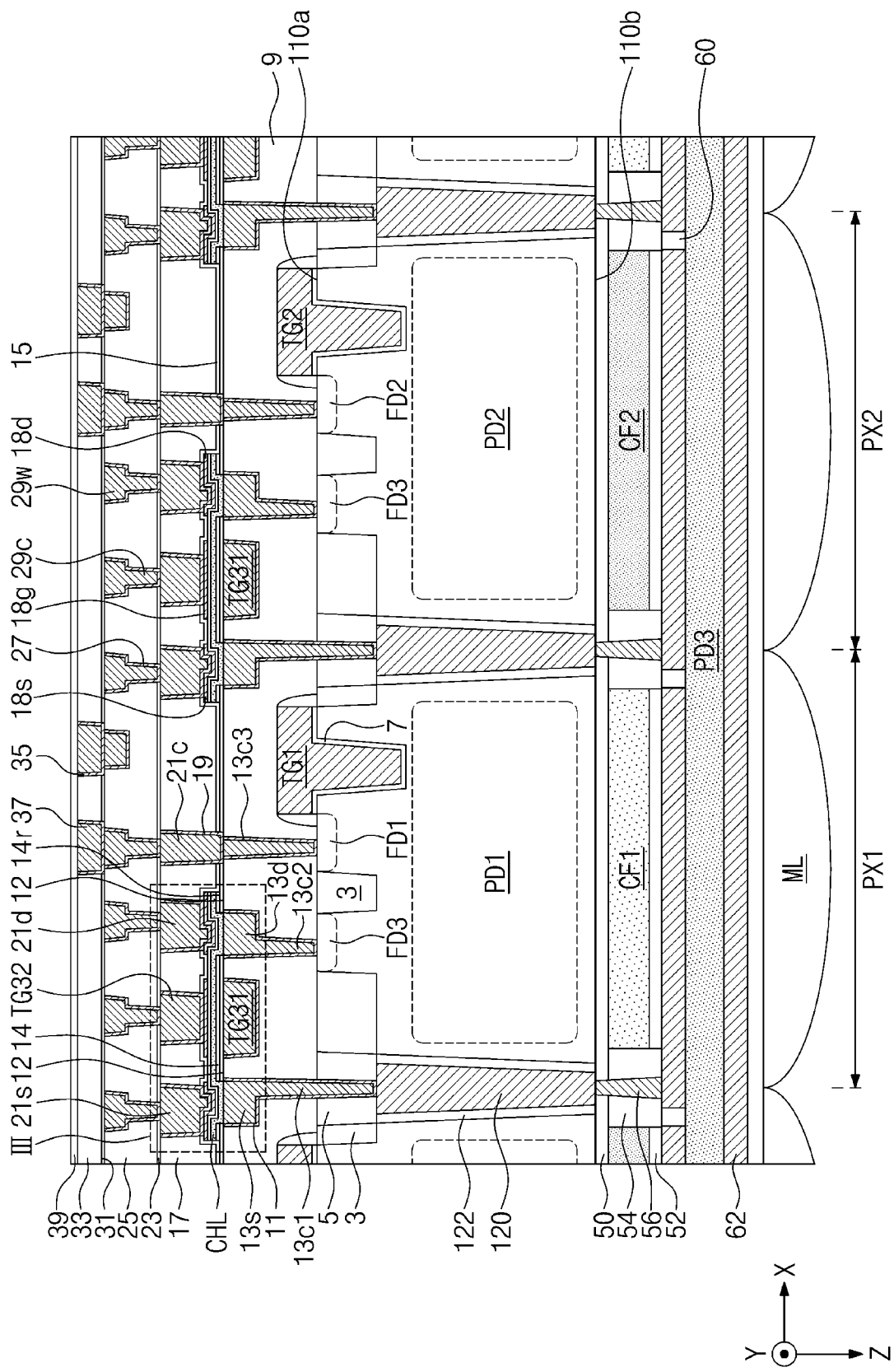
FIG. 7 illustrates a sectional view taken along a line I-I' of the image sensor of FIG. 2 according to embodiments of the inventive concepts.
Figure 8A:
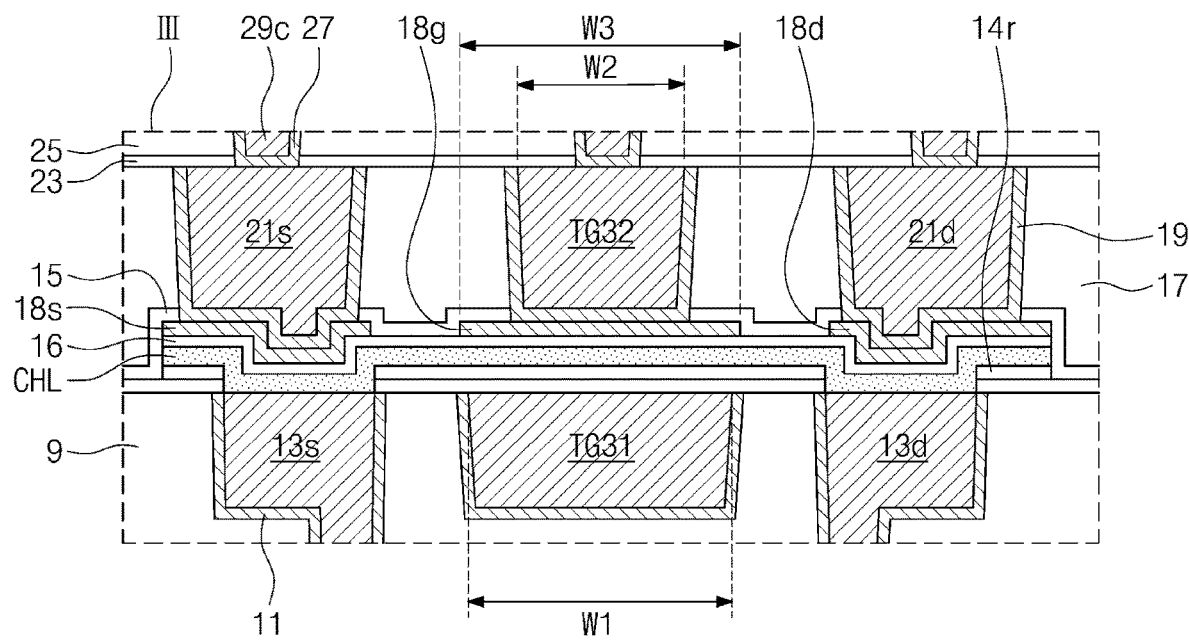
FIG. 8A illustrates an enlarged sectional view of a portion 'III' of FIG. 7.
Figure 8B:
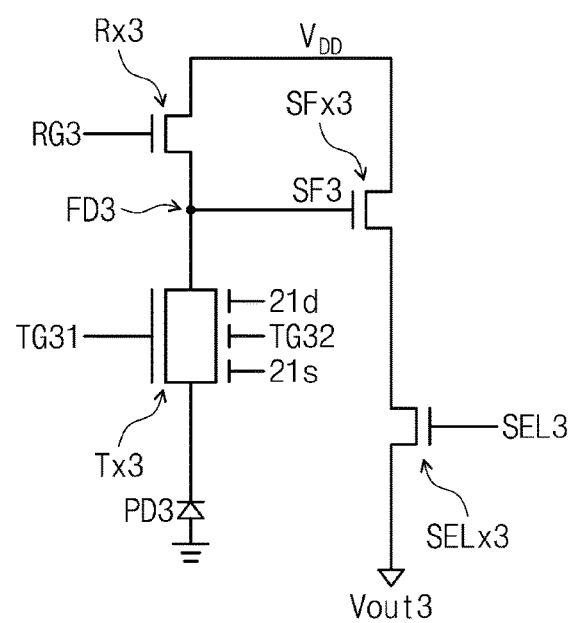
FIG. 8B illustrates a circuit diagram of the image sensor of FIG. 7.

FIG. 7 illustrates a sectional view taken along a line I-I' of an image sensor of FIG. 2 according to embodiments of the inventive concepts. FIG. 8A illustrates an enlarged sectional view of a portion 'III' of FIG. 7. FIG. 8B illustrates a circuit diagram of an image sensor of FIG. 7.

Referring to FIGS. 7 and 8A, the image sensor according to the present embodiment includes a first-level source electrode 13s, a first-level third transfer gate electrode TG31, and a first-level drain electrode 13d, which are disposed in the first interlayered insulating layer 9 to be spaced apart from each other. The first etch stop layer 12 and the second gate insulating layer 14 are sequentially stacked on the first-level third transfer gate electrode TG31. The channel pattern CHL is disposed on the second gate insulating layer 14. The channel pattern CHL may be provided to penetrate the second gate insulating layer 14 and the first etch stop layer 12 and to be in contact with the first-level source electrode 13s and the first-level drain electrode 13d. A third gate insulating layer 16 is disposed on the channel pattern CHL. The third gate insulating layer 16 may be an aluminum oxide layer or a silicon oxide layer.

A second-level third transfer gate electrode TG32 is disposed on (over) the third gate insulating layer 16. The second-level third transfer gate electrode TG32 may vertically overlap the first-level third transfer gate electrode TG31. The first-level third transfer gate electrode TG31 may have a first width W1. The second-level third transfer gate electrode TG32 may have a second width W2. The first width W1 may be larger than the second width W2. The channel pattern CHL is disposed (e.g., sandwiched) between the first-level third transfer gate electrode TG31 and the second-level third transfer gate electrode TG32.

A second-level source electrode 21s and a second-level drain electrode 21d are disposed on (over) the channel pattern CHL and are spaced apart from the second-level third transfer gate electrode TG32. The third gate insulating layer 16 may be extended to include portions, which are interposed between the channel pattern CHL and the second-level source electrode 21s and between the channel pattern CHL and the second-level drain electrode 21d. The second-level source electrode 21s may overlap the first-level source electrode 13s, when viewed in a plan view. The second-level drain electrode 21d may overlap the first-level drain electrode 13d, when viewed in a plan view. For example, the second-level source electrode 21s and a second-level drain electrode 21d may at least be characterized as respective first and second conductive patterns that face the first-level contact plugs 13c1 and 13d.

The second-level source electrode 21s, the second-level drain electrode 21d, and the second-level third transfer gate electrode TG32 may include metallic materials, which are different from the first-level source electrode 13s, the first-level drain electrode 13d, and the first-level third transfer gate electrode TG31. For example, the first-level source electrode 13s, the first-level drain electrode 13d, and the first-level third transfer gate electrode TG31 may include tungsten, whereas the second-level source electrode 21s, the second-level drain electrode 21d, and the second-level third transfer gate electrode TG32 may include copper.

Side and bottom surfaces of the second-level source electrode 21s, the second-level drain electrode 21d, and the second-level third transfer gate electrode TG32 are covered with the second diffusion barrier layer 19. A first capping pattern 18s may be interposed between the second-level source electrode 21s and the third gate insulating layer 16. A second capping pattern 18g may be interposed between the second-level third transfer gate electrode TG32 and the third gate insulating layer 16. The second capping pattern 18g may have a third width W3. The third width W3 may be larger than the second width W2. A third capping pattern 18d may be interposed between the second-level drain electrode 21d and the third gate insulating layer 16. The first to third capping patterns 18s, 18g, and 18d may be spaced apart from each other and may have substantially the same thickness and substantially the same material. In an embodiment, the first to third capping patterns 18s, 18g, and 18d may be formed of or include at least one of metal nitride materials (e.g., titanium nitride).

The first capping pattern 18s, the third gate insulating layer 16, the channel pattern CHL, and the remaining gate insulating layer 14r have side surfaces, which are aligned to each other and are covered with the second etch stop layer 15. The third capping pattern 18d, the third gate insulating layer 16, the channel pattern CHL, and the remaining gate insulating layer 14r have side surfaces which are aligned to each other and are covered with the second etch stop layer 15.

In an embodiment, the first-level third transfer gate electrode TG31 and the second-level third transfer gate electrode TG32 may be electrically connected to each other through an additional via plug (not shown). Here, the first-level third transfer gate electrode TG31 and the second-level third transfer gate electrode TG32 may behave like a single transfer gate electrode (e.g., the third transfer gate electrode TG3 of FIG. 5C).

In another embodiment, only the second-level third transfer gate electrode TG32 may behave like the third transfer gate electrode TG3 of FIG. 5C, and the first-level third transfer gate electrode TG31 may be applied with no voltage and may be in an electrically floating state. In this case, the first-level third transfer gate electrode TG31 may serve as a light-blocking pattern, not as a gate electrode. Since the first width W1 is larger than the second width W2, it may be possible to prevent light, which is incident through the second surface 110b, from being incident into the channel pattern CHL located below the second-level third transfer gate electrode TG32. Thus, it may be possible to prevent a change in threshold voltage of the third transfer transistor Tx3 of FIG. 5C.

In still another embodiment, the first-level third transfer gate electrode TG31 and the second-level third transfer gate electrode TG32 may be applied with respective voltages and may be used to control charge transfer in (i.e., through) the channel pattern CHL. In this case, the third transfer transistor Tx3 may be substantially the same as that of FIG. 8B. The first-level third transfer gate electrode TG31 or the second-level third transfer gate electrode TG32 may serve as a back-gate electrode. Furthermore, the second-level source electrode 21s and the second-level drain electrode 21d may also be applied with voltages. The second-level source electrode 21s and the second-level drain electrode 21d may be disposed on the third gate insulating layer 16 and may serve as an additional auxiliary gate electrode. In this case, motion of charges in the channel pattern CHL may be controlled by the first-level third transfer gate electrode TG31, the second-level third transfer gate electrode TG32, the second-level source electrode 21s, and the second-level drain electrode 21d. Other elements and their operations may be substantially the same as or similar to those described with reference to FIGS. 2 to 4, 5A, and 5B, and description of such similar elements and their operations are omitted for brevity.

FIGS. 9A to 9D illustrate sectional views sequentially showing a process of fabricating the image sensor of FIG. 7.

Figure 9A:
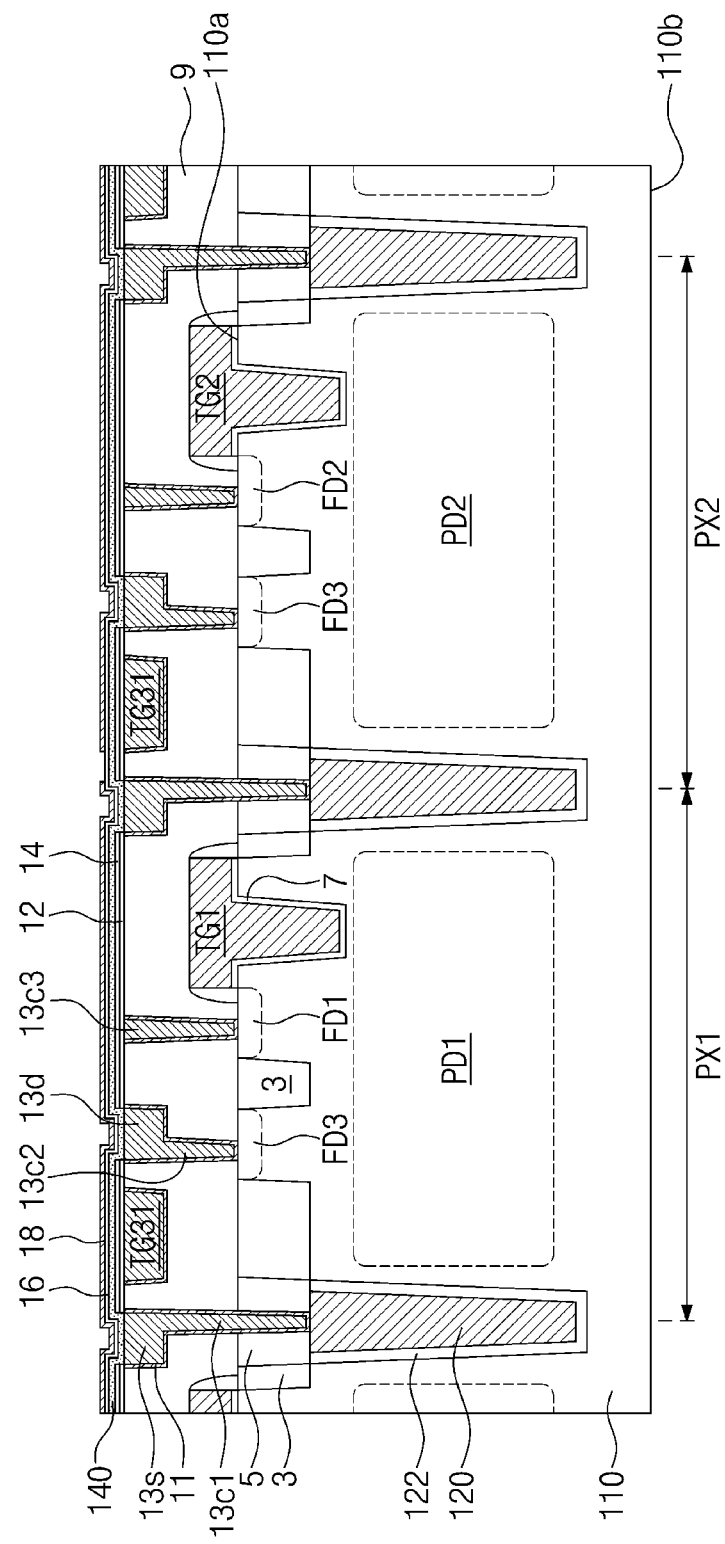
FIGS. 9A, 9B, 9C and 9D illustrate sectional views sequentially showing a process of fabricating the image sensor of FIG. 7.

Referring to FIG. 9A, following the processing previously described with respect to FIG. 6C, the third gate insulating layer 16 and a capping layer 18 are sequentially and conformally formed on the channel layer 140. In an embodiment, the third gate insulating layer 16 may be formed of aluminum oxide or silicon oxide. The capping layer 18 may be formed of or include titanium nitride. Although not shown, a mask pattern may be formed on the capping layer 18 to define the shape of the channel pattern CHL of FIG. 3. The mask pattern may be, for example, a photoresist pattern.

Figure 9B:
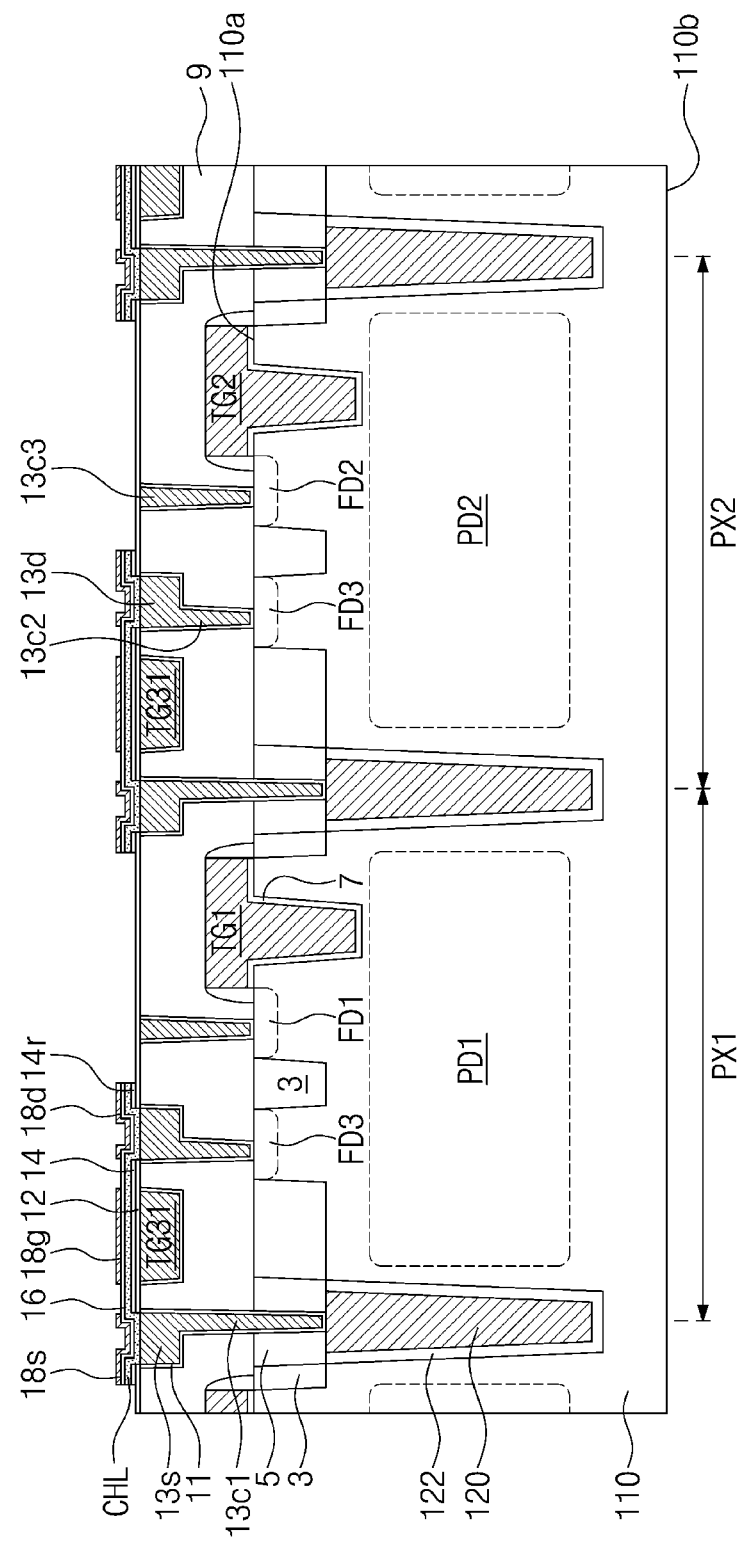

Referring to FIG. 9B, the capping layer 18, the third gate insulating layer 16, the channel layer 140, and the second gate insulating layer 14 may be sequentially patterned using the mask pattern as an etch mask. In an embodiment, the channel pattern CHL may be formed through this patterning process. In another embodiment, a capping pattern may be first formed by patterning the capping layer 18 using the mask pattern, and then, the mask pattern may be removed. Thereafter, the third gate insulating layer 16, the channel layer 140, and the second gate insulating layer 14 may be sequentially patterned using the capping pattern as an etch mask or a hard mask, and then, the capping pattern may be further patterned to form the first to third capping patterns 18s, 18g, and 18d spaced apart from each other and to expose the third gate insulating layer 16 between the first to third capping patterns 18s, 18g, and 18d.

Figure 9C:
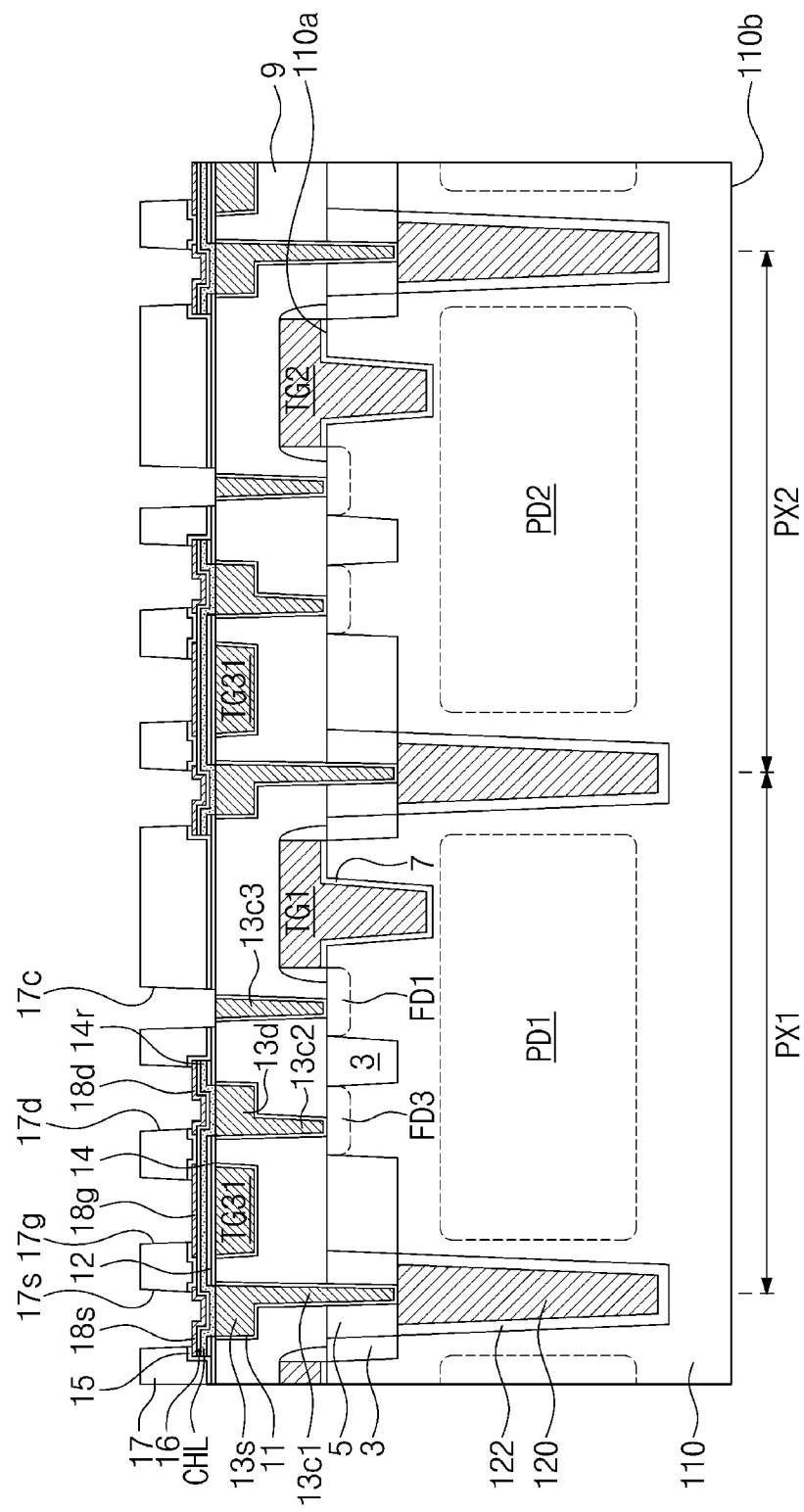

Referring to FIG. 9C, a BEOL process may be performed. In detail, the second etch stop layer 15 and the second interlayered insulating layer 17 are sequentially formed on the first surface 110a of the semiconductor substrate 110 provided with the first to third capping patterns 18s, 18g, and 18d. Thereafter, the second interlayered insulating layer 17 and the second etch stop layer 15 may be sequentially etched to form a second-level source trench region 17s, a second-level gate trench region 17g, and a second-level drain trench region 17d exposing the first to third capping patterns 18s, 18g, and 18d, respectively. In an embodiment, during the formation of the trench regions 17s, 17g, and 17d, the second interlayered insulating layer 17, the second etch stop layer 15, and the first etch stop layer 12 may be sequentially etched to form a second-level contact hole 17c. When the second-level contact hole 17c is formed, the first to third capping patterns 18s, 18g, and 18d may be used as an etch stop layer protecting the third gate insulating layer 16.

Figure 9D:
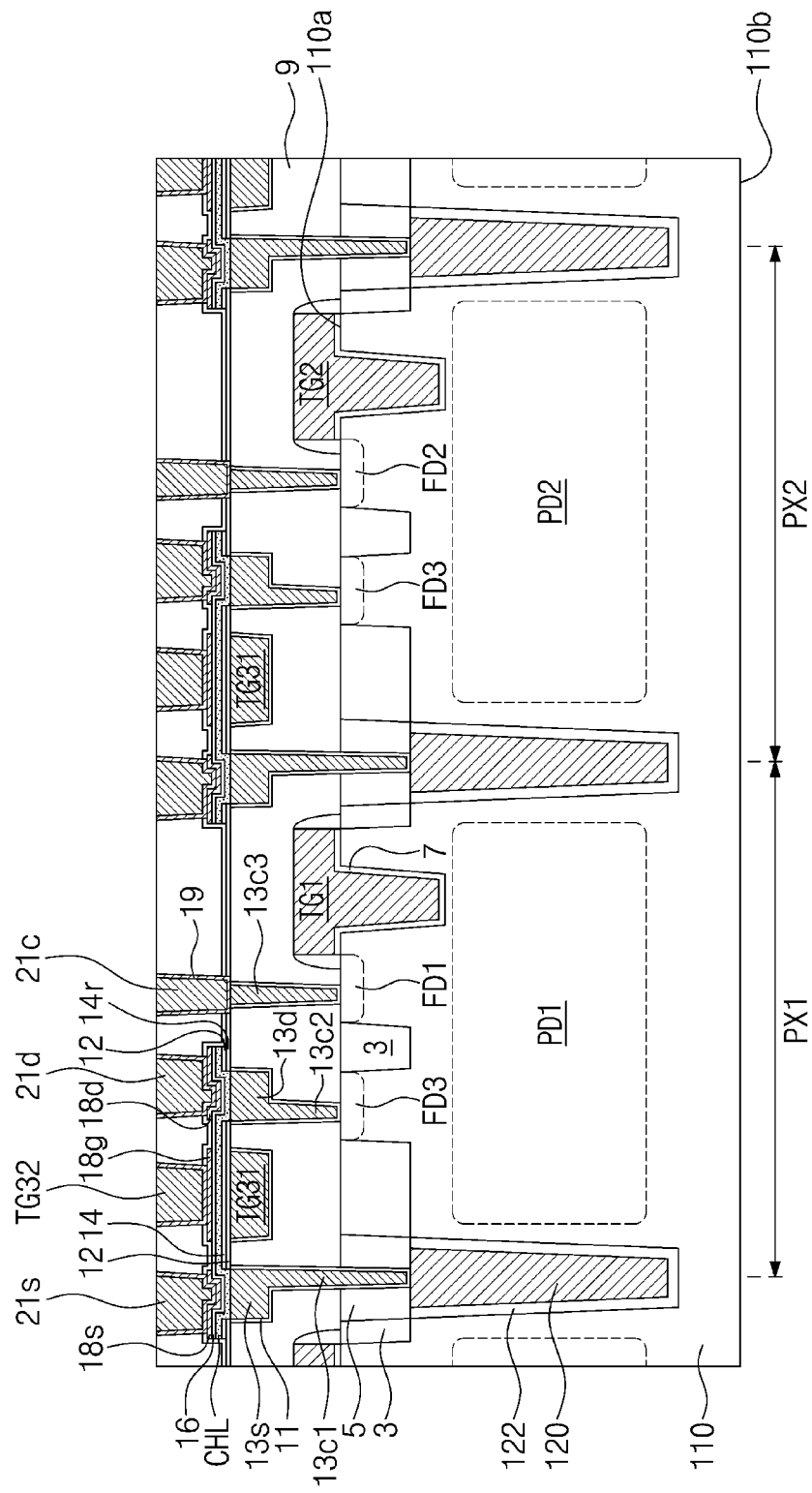

Referring to FIG. 9D, the second diffusion barrier layer 19 is conformally formed on the second interlayered insulating layer 17, and a conductive layer is formed to fill the trench regions 17s, 17g, and 17d and the second-level contact hole 17c. Thereafter, a polishing process may be performed on the conductive layer to from the second-level source electrode 21s, the second-level third transfer gate electrode TG32, the second-level drain electrode 21d, and the second-level contact plug 21c. A subsequent process may be performed in the same or similar manner as described with reference to FIG. 6E and FIG. 3.

Figure 10:
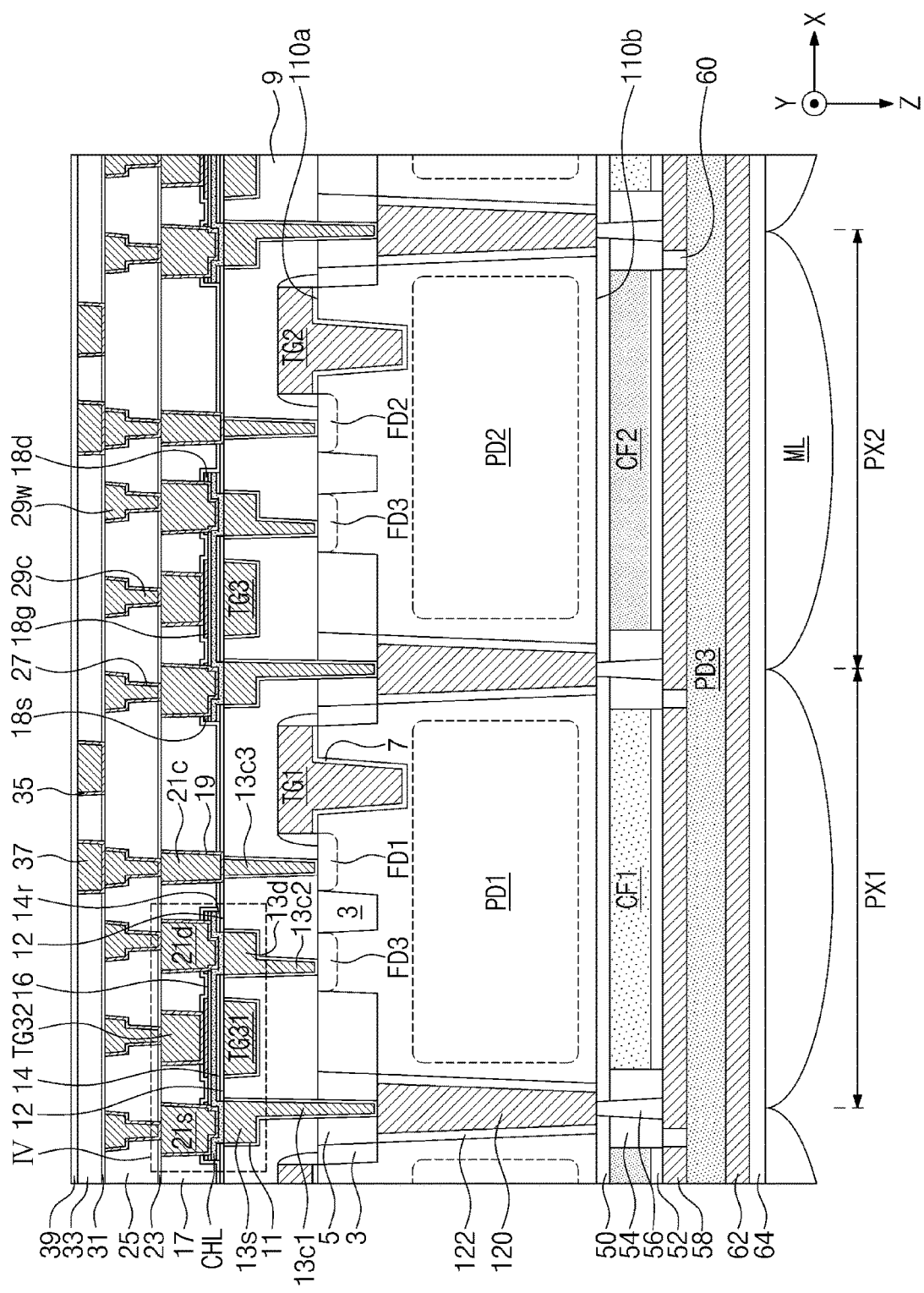
FIG. 10 illustrates a sectional view taken along a line I-I' of the image sensor of FIG. 2 according to embodiments of the inventive concepts.
Figure 11A:
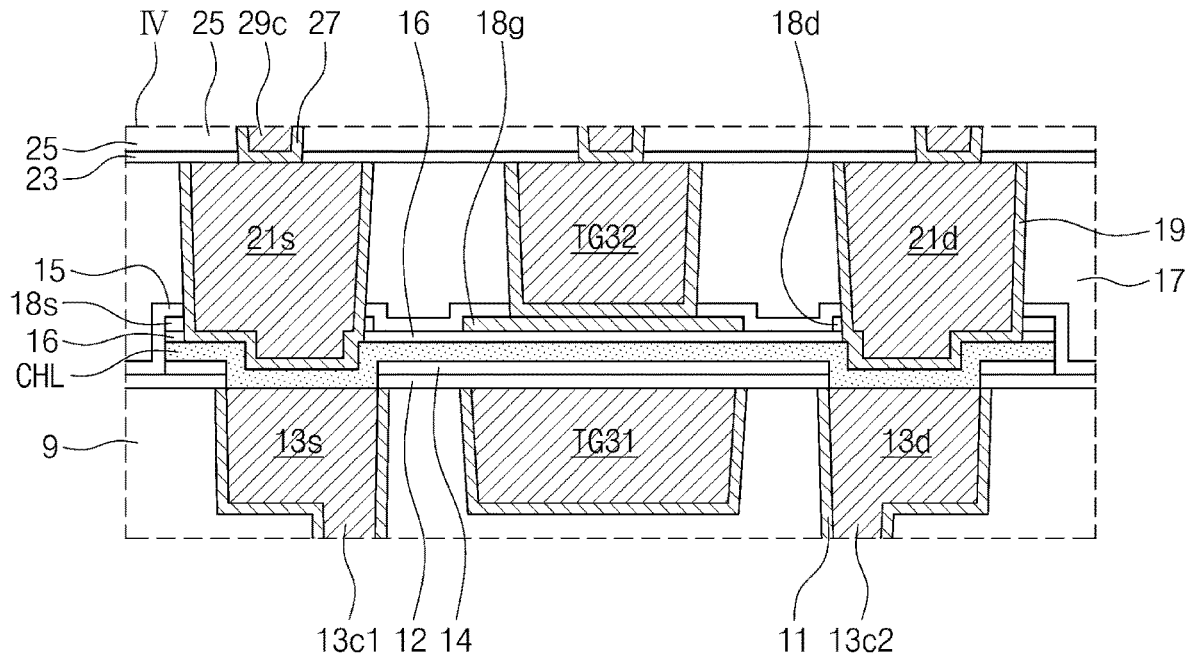
FIG. 11A illustrates an enlarged sectional view of a portion 'IV' of FIG. 10.
Figure 11B:
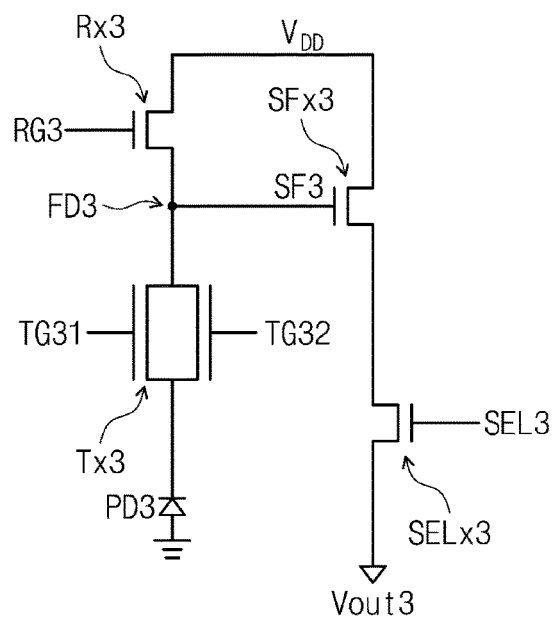
FIG. 11B illustrates a circuit diagram of the image sensor of FIG. 10.

FIG. 10 illustrates a sectional view taken along a line I-I' of the image sensor of FIG. 2 according to embodiments of the inventive concepts. FIG. 11A illustrates an enlarged sectional view of a portion 'IV' of FIG. 10. FIG. 11B illustrates a circuit diagram of an image sensor of FIG. 10.

Referring to FIGS. 10, 11A, and 11B, in the image sensor according to the present embodiment, the third gate insulating layer 16 is not interposed between the channel pattern CHL and the second-level source electrode 21s and is not interposed between the channel pattern CHL and the second-level drain electrode 21d. Under the second-level source electrode 21s and under the second-level drain electrode 21d, the second diffusion barrier layer 19 penetrates the first and third capping patterns 18s and 18d and the third gate insulating layer 16, and is in direct contact with the channel pattern CHL. In other words, the second-level source electrode 21s and the second-level drain electrode 21d may be electrically connected to the channel pattern CHL. In this case, the second-level source electrode 21s and the second-level drain electrode 21d do not serve as auxiliary gate electrodes, unlike the previous embodiments of FIGS. 7, 8A and 8B. Motion of charges in the channel pattern CHL may be controlled by the first-level third transfer gate electrode TG31 and the second-level third transfer gate electrode TG32 in this embodiment. Other elements and their operations may be substantially the same as or similar to those described with reference to FIGS. 2 to 4, 5A, and 5B, and description of such similar elements and their operations are omitted for brevity.

Figure 12:
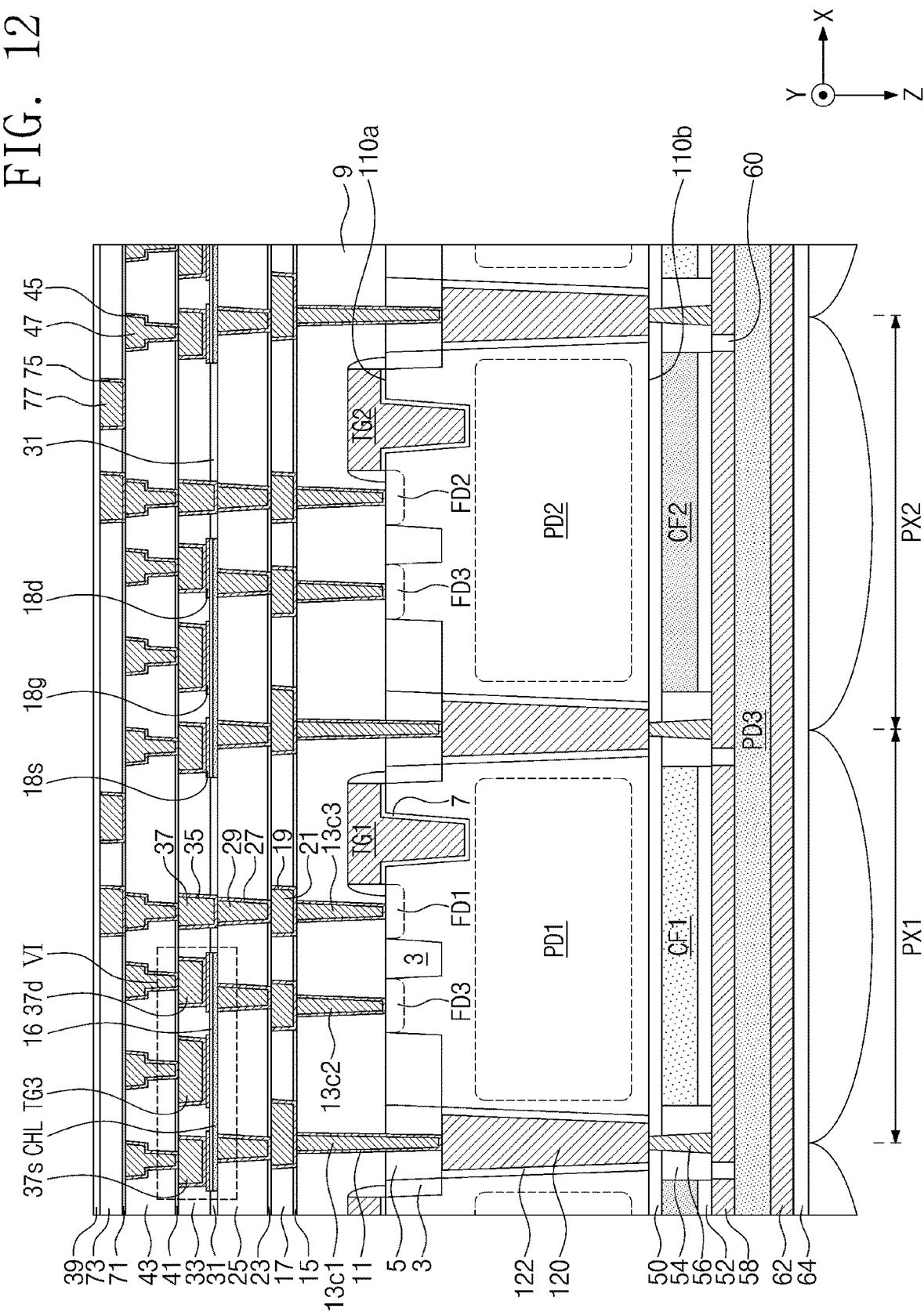
FIG. 12 illustrates a sectional view taken along a line I-I' of the image sensor of FIG. 2 according to embodiments of the inventive concepts.
Figure 13A:
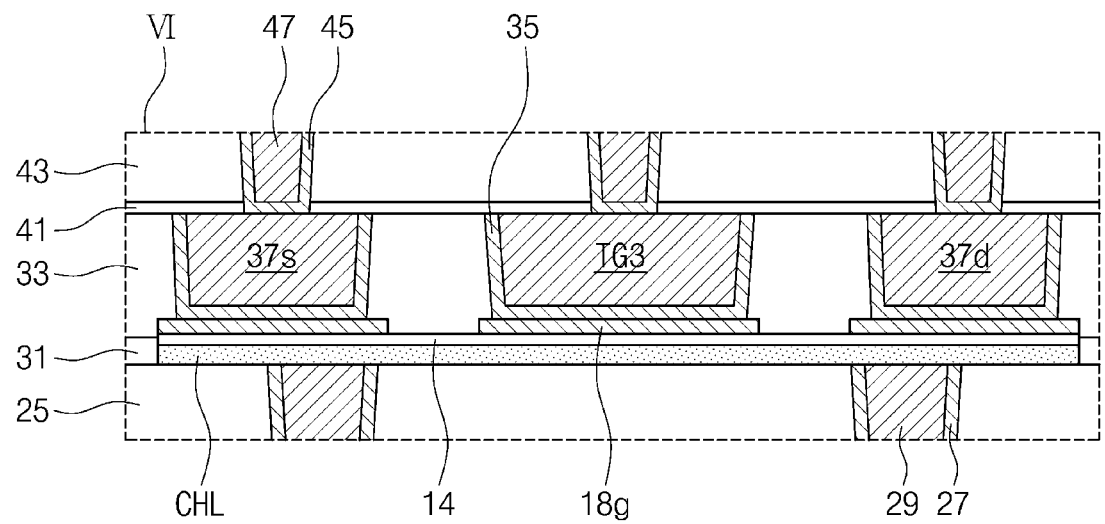
FIG. 13A illustrates an enlarged sectional view of a portion 'VI' of FIG. 12.
Figure 13B:
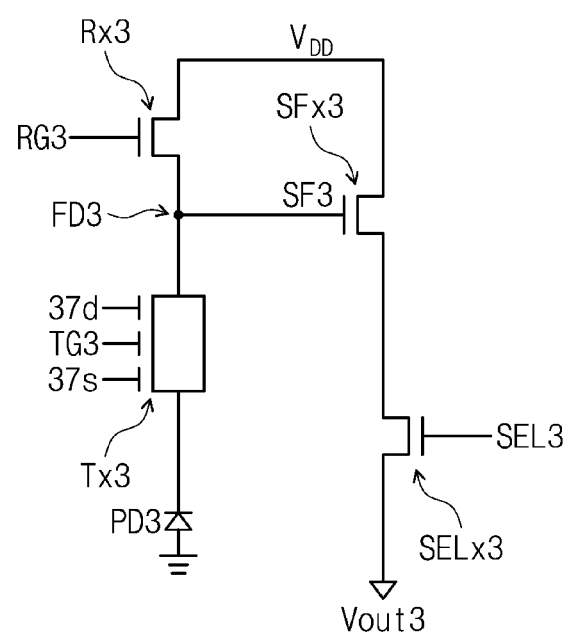
FIG. 13B illustrates a circuit diagram of the image sensor of FIG. 12.

FIG. 12 illustrates a sectional view taken along a line I-I' of the image sensor of FIG. 2 according to embodiments of the inventive concepts. FIG. 13A illustrates an enlarged sectional view of a portion 'VI' of FIG. 12. FIG. 13B illustrates a circuit diagram of an image sensor of FIG. 12.

Referring to FIGS. 12 and 13A, in the image sensor according to the present embodiment, a third transfer gate electrode TG3, a source electrode 37s, and a drain electrode 37d are disposed in the fourth interlayered insulating layer 33. The first surface 110a of the semiconductor substrate 110 is covered with the first interlayered insulating layer 9. In the present example, there are no recessed regions in an upper region of the first interlayered insulating layer 9. The first-level contact plugs 13c1, 13c2, and 13c3 are disposed in the first interlayered insulating layer 9 to be spaced apart from each other. The second etch stop layer 15 and the second interlayered insulating layer 17 are sequentially stacked on the first interlayered insulating layer 9. Second-level lines 21 may be disposed in the second interlayered insulating layer 17. The third etch stop layer 23 and the third interlayered insulating layer 25 are sequentially stacked on the second interlayered insulating layer 17. Third-level lines 29 may be disposed in the third interlayered insulating layer 25. The fourth etch stop layer 31 is disposed on the third interlayered insulating layer 25. A portion of a top surface of the third interlayered insulating layer 25 is not covered with the fourth etch stop layer 31 and is exposed.

The channel pattern CHL is disposed on the exposed portion of the third interlayered insulating layer 25. The channel pattern CHL may be in direct contact with portions of the third-level lines 29. An end of the channel pattern CHL may be electrically connected to the through electrode 120, and another end of the channel pattern CHL may be electrically connected to the third floating diffusion region FD3. The second gate insulating layer 14 is disposed on the channel pattern CHL. The source electrode 37s, the third transfer gate electrode TG3, and the drain electrode 37d, which are spaced apart from each other, are disposed on the second gate insulating layer 14. The capping patterns 18s, 18g, and 18d are interposed between the electrodes 37s, TG3, and 37d and the second gate insulating layer 14. The fourth interlayered insulating layer 33 may be disposed on the fourth etch stop layer 31. The fourth-level lines 37, which are spaced apart from the electrodes 37s, TG3, and 37d, may be disposed in the fourth interlayered insulating layer 33. A fifth etch stop layer 41, a fifth interlayered insulating layer 43, a sixth etch stop layer 71, a sixth interlayered insulating layer 73, and the first passivation layer 39 are sequentially stacked on the fourth interlayered insulating layer 33. Fifth-level lines 47 and a fifth diffusion barrier layer 45 are disposed in the fifth interlayered insulating layer 43. Sixth-level lines 77 and a sixth diffusion barrier layer 75 are disposed in the sixth interlayered insulating layer 73. Although not shown, the second-level lines to the sixth-level lines 21, 29, 37, 47, and 77 may include via plugs and conductive pads, in addition to the interconnection lines. In an embodiment, the first-level contact plugs 13c1, 13c2, and 13c3 may be formed of or include, for example, tungsten. In an embodiment, all of the second-level lines 21, the third-level lines 29, the source electrode 37s, the third transfer gate electrode TG3, the drain electrode 37d, the fifth-level lines 47, and the sixth-level lines 77 may include copper.

Referring to FIG. 13B, in the image sensor of FIGS. 12 and 13A, the source electrode 37s and the drain electrode 37d may serve as auxiliary gate electrodes. For example, in the third transfer transistor Tx3, motion of charges in the channel pattern CHL may be controlled by the source electrode 37s, the third transfer gate electrode TG3, and the drain electrode 37d. Other elements and their operations may be substantially the same as or similar to those described with reference to FIGS. 2 to 4, 5A, and 5B, and description of such similar elements and their operations are omitted for brevity.

Figure 14A:
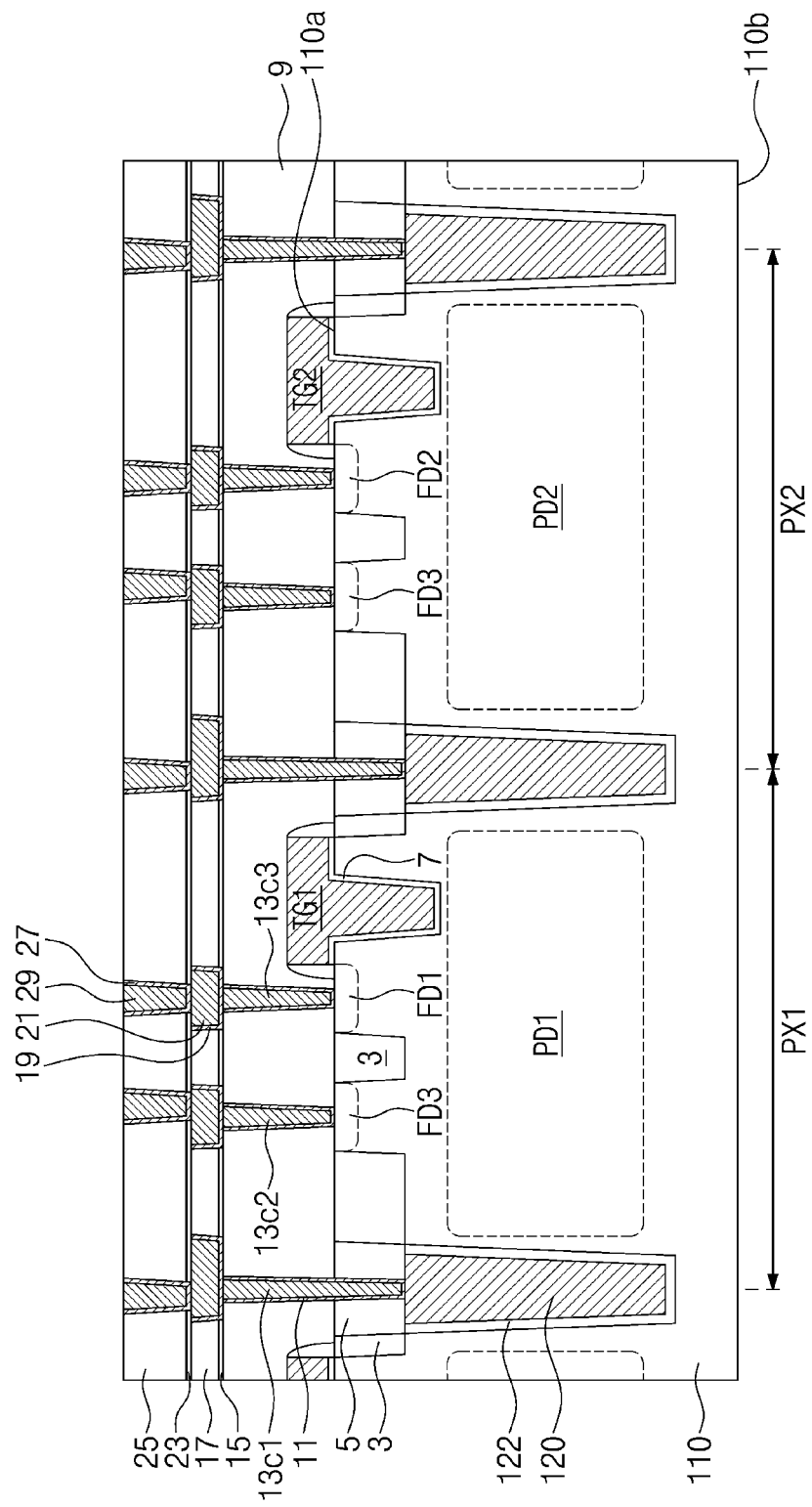
FIGS. 14A, 14B and 14C illustrate sectional views sequentially showing a process of fabricating the image sensor of FIG. 12.
Figure 14B:
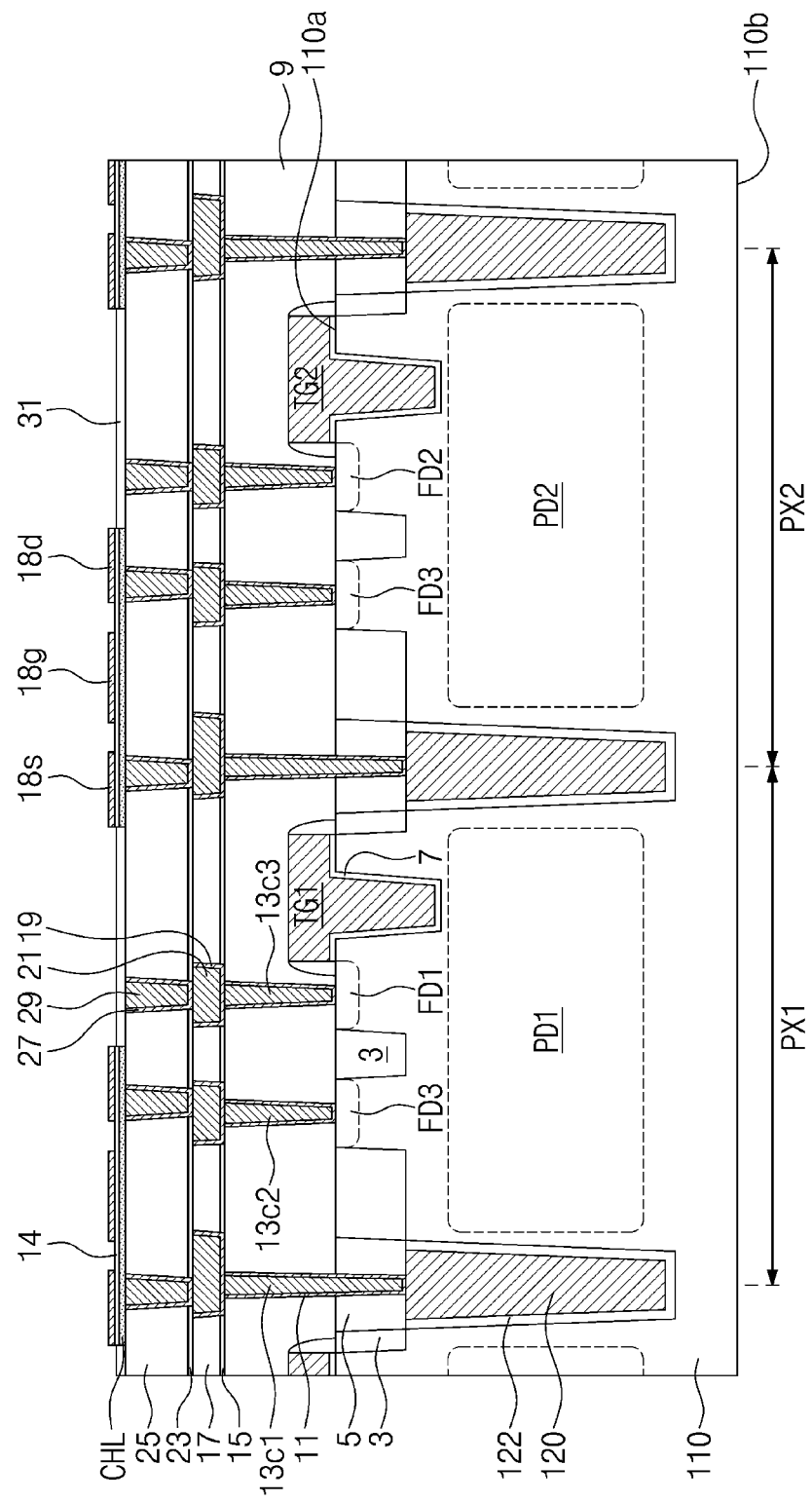
Figure 14C:
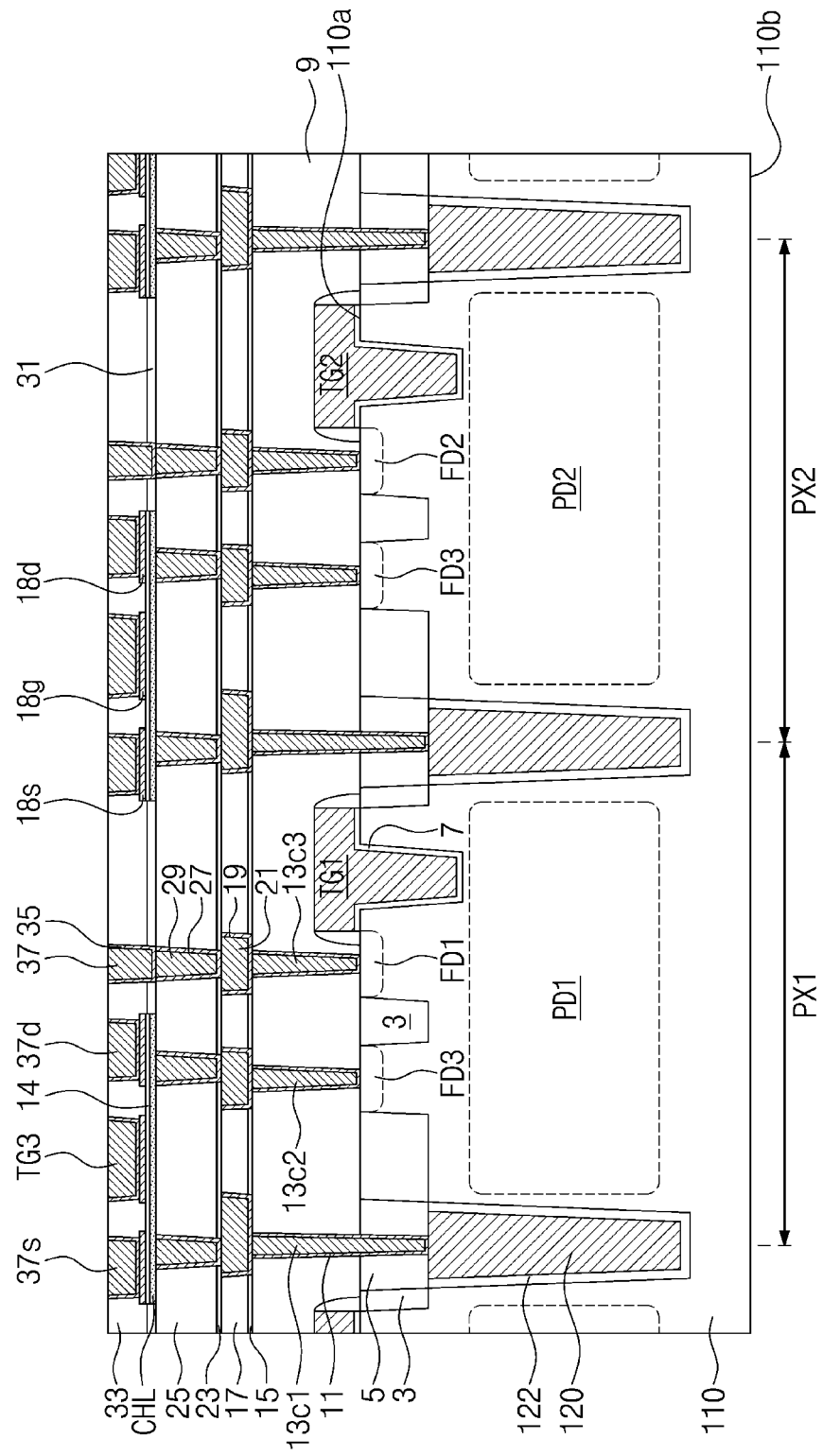

FIGS. 14A to 14C illustrate sectional views sequentially showing a process of fabricating the image sensor of FIG. 12.

Referring to FIG. 14A, as in the processing described with respect to FIG. 6A, the first interlayered insulating layer 9 is formed to cover the first surface 110a of the semiconductor substrate 110. The first-level contact plugs 13c1, 13c2, and 13c3 and the first diffusion barrier layer 11 are formed in the first interlayered insulating layer 9. The second etch stop layer 15 and the second interlayered insulating layer 17 are sequentially stacked on the first interlayered insulating layer 9. The second-level lines 21 and the second diffusion barrier layer 19 are formed in the second interlayered insulating layer 17. A third etch stop layer 23 and the third interlayered insulating layer 25 are sequentially stacked on the second interlayered insulating layer 17. The third-level lines 29 are formed in the third interlayered insulating layer 25.

Referring to FIG. 14B, the fourth etch stop layer 31 is stacked on the third interlayered insulating layer 25. The fourth etch stop layer 31 may be formed of or include at least one of, for example, silicon nitride, silicon oxide, silicon oxynitride, or silicon carbon nitride (SiCN). The fourth etch stop layer 31 may be patterned to expose a top surface of the third interlayered insulating layer 25 and portions of the third-level lines 29. A channel layer, the second gate insulating layer 14, and a capping layer may be sequentially formed on the fourth etch stop layer 31 and then sequentially patterned. As a result, the channel pattern CHL, the second gate insulating layer 14, and a capping pattern are formed. Here, the second gate insulating layer 14 and the capping pattern may be formed to have the same shape as the channel pattern CHL. Thereafter, the capping pattern may be etched to form the first to third capping patterns 18s, 18g, and 18d spaced apart from each other.

Referring to FIG. 14C, the fourth interlayered insulating layer 33 is formed over the first surface 110a of the semiconductor substrate 110 provided with the first to third capping patterns 18s, 18g, and 18d. The source electrode 37s, the third transfer gate electrode TG3, the drain electrode 37d, and the fourth-level lines 37, which are spaced apart from each other, are formed in the fourth interlayered insulating layer 33.

Figure 15:
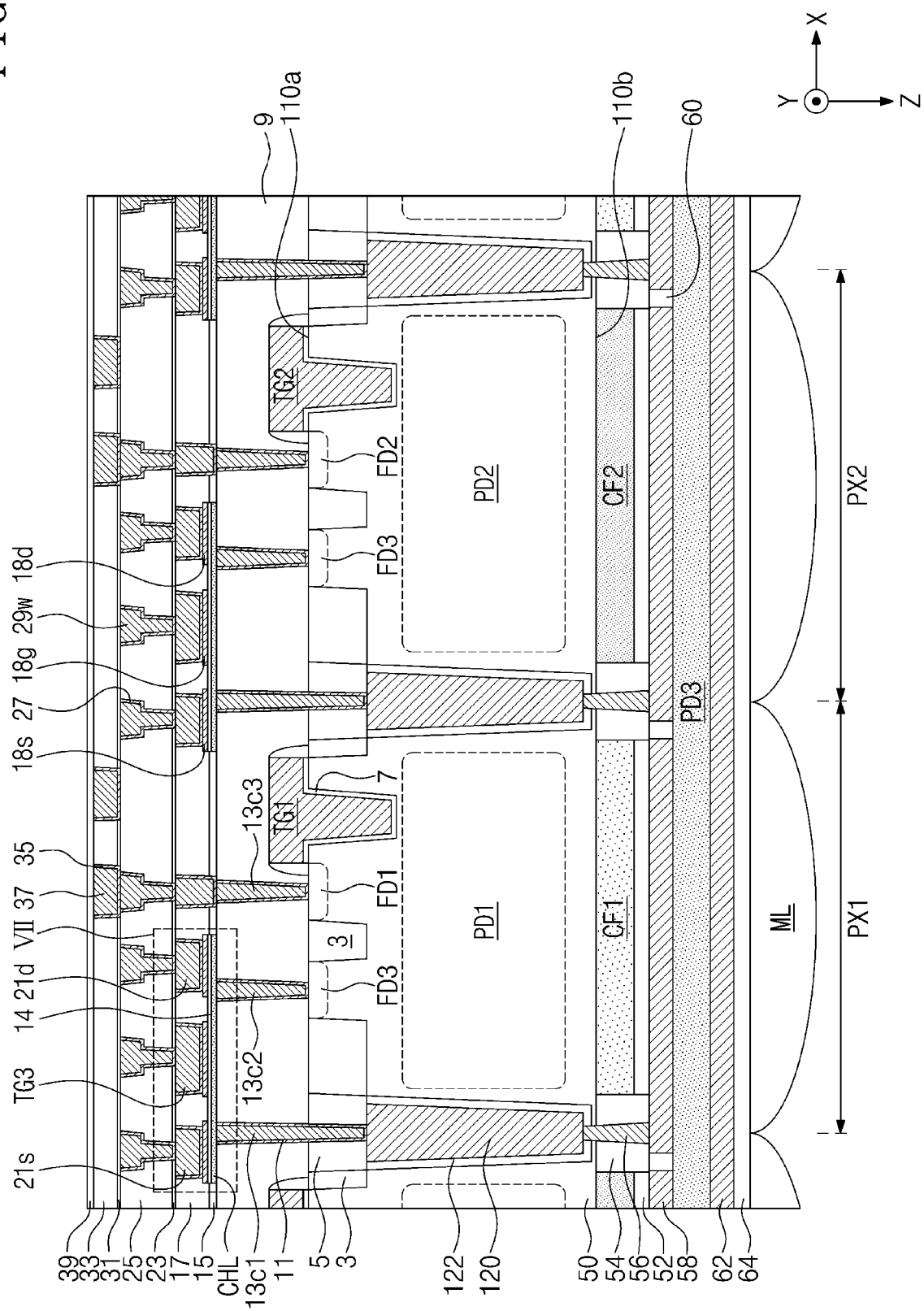
FIG. 15 illustrates a sectional view taken along a line I-I' of the image sensor of FIG. 2 according to embodiments of the inventive concepts.
Figure 16:
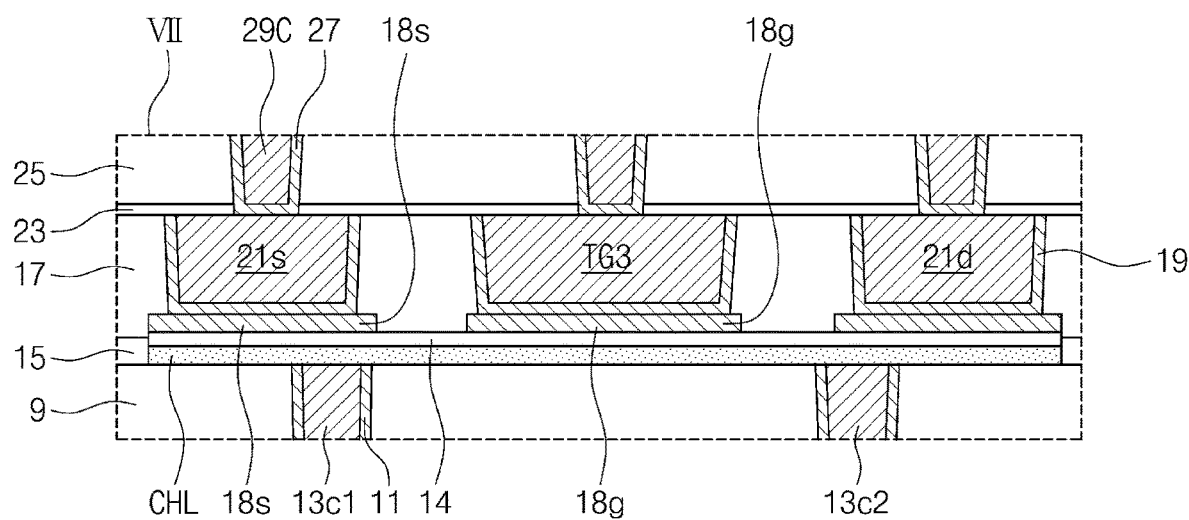
FIG. 16 illustrates an enlarged sectional view of a portion 'VII' of FIG. 15.

FIG. 15 illustrates a sectional view taken along a line I-I' of an image sensor of FIG. 2 according to embodiments of the inventive concepts. FIG. 16 illustrates an enlarged sectional view of a portion 'VII' of FIG. 15.

Referring to FIGS. 15 and 16, in the image sensor according to the present embodiment, the source electrode 21s, the third transfer gate electrode TG3, and the drain electrode 21d are disposed in the second interlayered insulating layer 17. The channel pattern CHL is in contact with the first interlayered insulating layer 9. A portion of the channel pattern CHL near one end thereof is in contact with the first-level first contact plug 13c1, and another portion of the channel pattern CHL near another end thereof is in contact with the first-level second contact plug 13c2. Other elements may be substantially the same as or similar to those described previously, and description of such similar elements is omitted for brevity.

Figure 17:
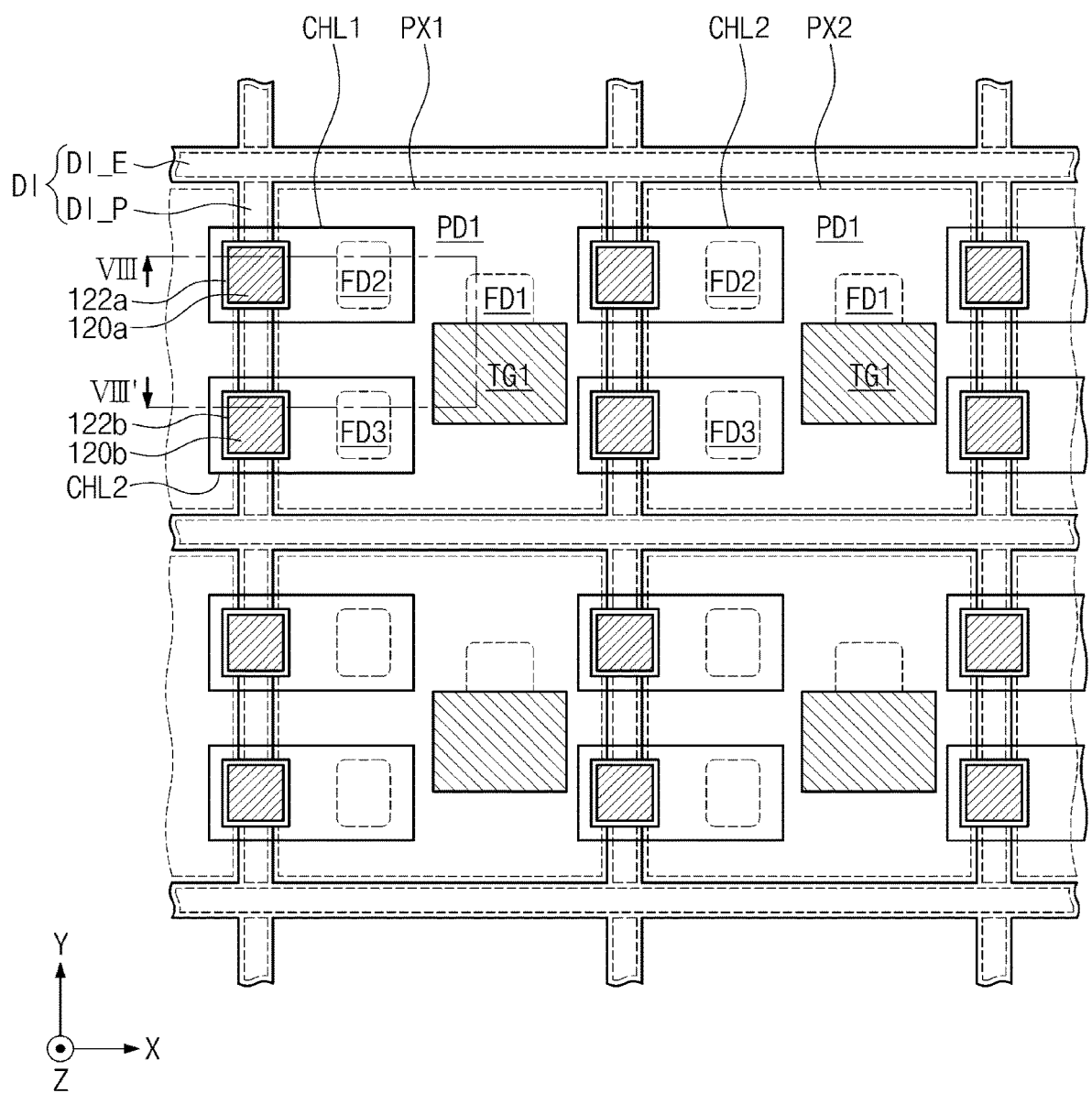
FIG. 17 illustrates a plan view of an image sensor according to embodiments of the inventive concepts.
Figure 18:
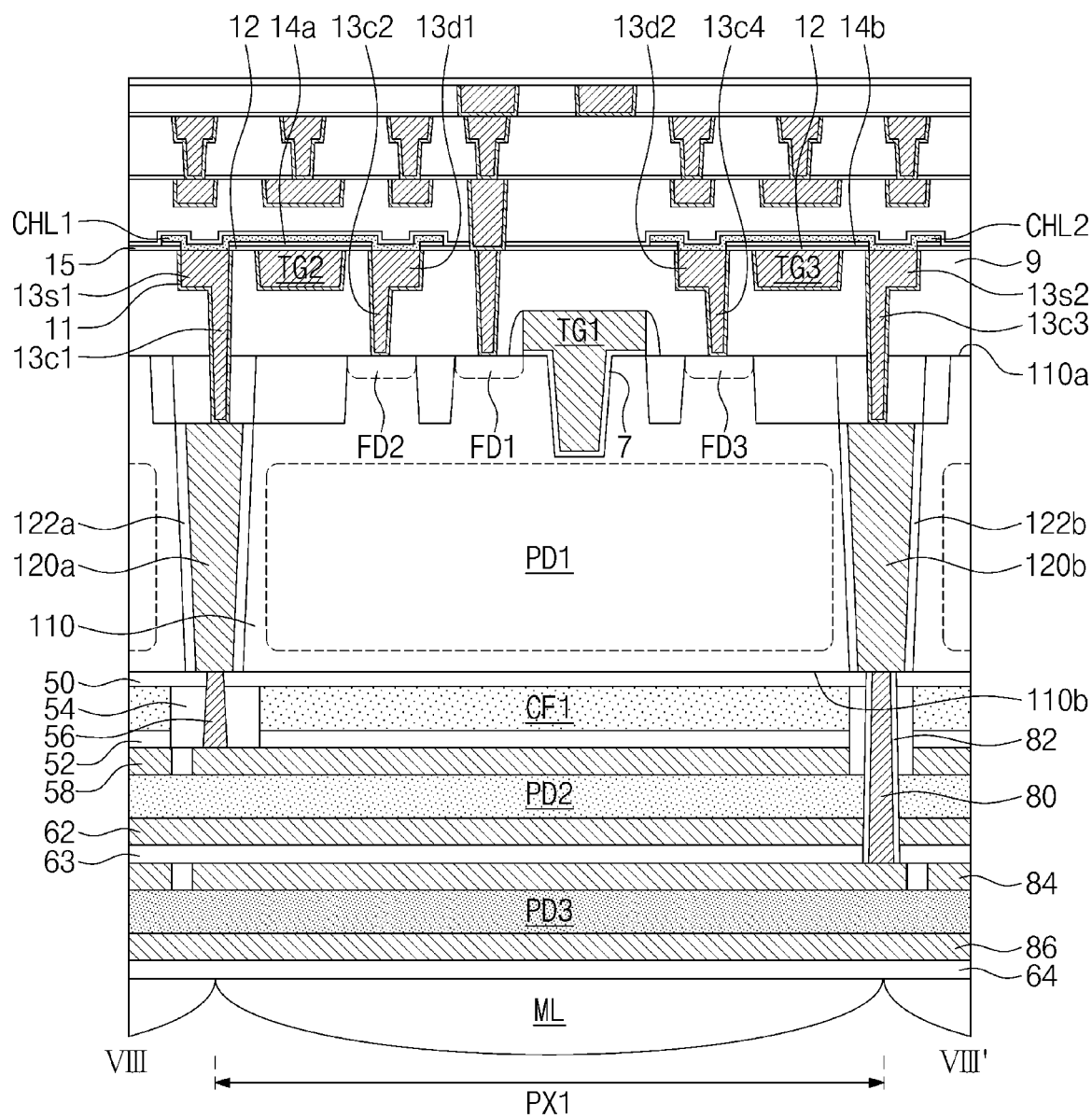
FIG. 18 illustrates a sectional view taken along a line VIII-VIII' of FIG. 17.

FIG. 17 illustrates a plan view of an image sensor according to embodiments of the inventive concepts. FIG. 18 illustrates a sectional view of the image sensor taken along a line VIII-VIII' of FIG. 17.

Referring to FIGS. 17 and 18, in the image sensor according to the present embodiment, each pixel PX1 or PX2 may be configured to obtain information on three different colors at the same time. In detail, the semiconductor substrate 110 includes the first surface 110a and the second surface 110b facing each other. The semiconductor substrate 110 may be doped with P-type impurities. In each pixel PX1 or PX2, the first photoelectric conversion part PD1 is disposed in the semiconductor substrate 110. The first photoelectric conversion part PD1 may be, for example, an impurity region doped with N-type impurities. The first through electrode 120a and the second through electrode 120b, which are spaced apart from each other, are disposed in the semiconductor substrate 110. The first via insulating layer 122a may be interposed between the first through electrode 120a and the semiconductor substrate 110. The second via insulating layer 122b may be interposed between the second through electrode 120b and the semiconductor substrate 110.

In each pixel PX1 or PX2, the protection layer 50, the first color filter CF1, the second insulating pattern 52, a first pixel electrode 58, the second photoelectric conversion part PD2, a first common electrode 62, a third insulating pattern 63, a second pixel electrode 84, the third photoelectric conversion part PD3, a second common electrode 86, the second passivation layer 64, and the micro lens ML are sequentially stacked on the second surface 110b of the semiconductor substrate 110. The first insulating pattern 54 may be disposed between the first color filters CF1. The first through electrode 120a may be electrically connected to the first pixel electrode 58 through the first via plug 56, which is formed to penetrate the first insulating pattern 54 and the protection layer 50. The second through electrode 120b may be electrically connected to the second pixel electrode 84 through a second via plug 80. A side surface of the second via plug 80 may be covered with a third via insulating layer 82.

All of the first and second pixel electrodes 58 and 84 and the first and second common electrodes 62 and 86 may include indium-tin oxide (ITO), indium-zinc oxide (IZO), zinc oxide (ZnO), and/or organic transparent conductive materials. The second and third photoelectric conversion parts PD2 and PD3 may sense only light of a specific wavelength and generate charge, even when light of various other wavelengths are incident thereto. In an embodiment, the second and third photoelectric conversion parts PD2 and PD3 may be organic photoelectric conversion layers. Each of the second and third photoelectric conversion parts PD2 and PD3 may contain a P-type organic semiconductor material and an N-type organic semiconductor material, or may contain quantum dots or chalcogenide materials.

The first transfer gate electrode TG1 is disposed on the semiconductor substrate 110. The first gate insulating layer 7 is interposed between the first transfer gate electrode TG1 and the semiconductor substrate 110. The first floating diffusion region FD1 may be disposed in a region of the semiconductor substrate 110 adjacent to the first transfer gate electrode TG1. In each pixel PX1 or PX2, the second floating diffusion region FD2 and the third floating diffusion region FD3, which are spaced apart from the first floating diffusion region FD1, may be disposed in the semiconductor substrate 110. The first surface 110a of the semiconductor substrate 110 is covered with the first interlayered insulating layer 9. A first source electrode 13s1, the second transfer gate electrode TG2, and a first drain electrode 13d1, which are spaced apart from each other, are disposed in the first interlayered insulating layer 9. In addition, a second source electrode 13s2, the third transfer gate electrode TG3, and a second drain electrode 13d2, which are spaced apart from each other are disposed in the first interlayered insulating layer 9. The second gate insulating layer 14a and a first channel pattern CHL1 are sequentially stacked on the second transfer gate electrode TG2. The first channel pattern CHL1 may be laterally extended to be in contact with the first source electrode 13s1 and the first drain electrode 13d1. A third gate insulating layer 14b and a second channel pattern CHL2 are sequentially stacked on the third transfer gate electrode TG3. The second channel pattern CHL2 may be laterally extended to be in contact with the second source electrode 13s2 and the second drain electrode 13d2.

The first photoelectric conversion part PD1 may be configured to generate charges from light of a first wavelength passing through the first color filter CF1. Such charges may be transferred to the first floating diffusion region FD1 by the first transfer gate electrode TG1.

The second photoelectric conversion part PD2 may be configured to generate charges from light of a second wavelength. Such charges may be transferred to the first channel pattern CHL1 through the first pixel electrode 58, the first via plug 56, the first through electrode 120a, the first-level first contact plug 13c1, and the first source electrode 13s1, and may be then transferred to the second floating diffusion region FD2 through the first drain electrode 13d1 and the first-level second contact plug 13c2 when a voltage is applied to the second transfer gate electrode TG2.

The third photoelectric conversion part PD3 may be configured to generate charges from light of a third wavelength. Such charges may be transferred to the second channel pattern CHL2 through the second pixel electrode 84, the second via plug 80, the second through electrode 120b, the first-level third contact plug 13c3, and the second source electrode 13s2, and may be then transferred to the third floating diffusion region FD3 through the second drain electrode 13d2 and a first-level fourth contact plug 13c4 when a voltage is applied to the third transfer gate electrode TG3. Other elements and their operations may be substantially the same as or similar to those described with reference to FIGS. 2 to 4, 5A, and 5B, and description of such similar elements and their operation are omitted for brevity.

Figure 19:
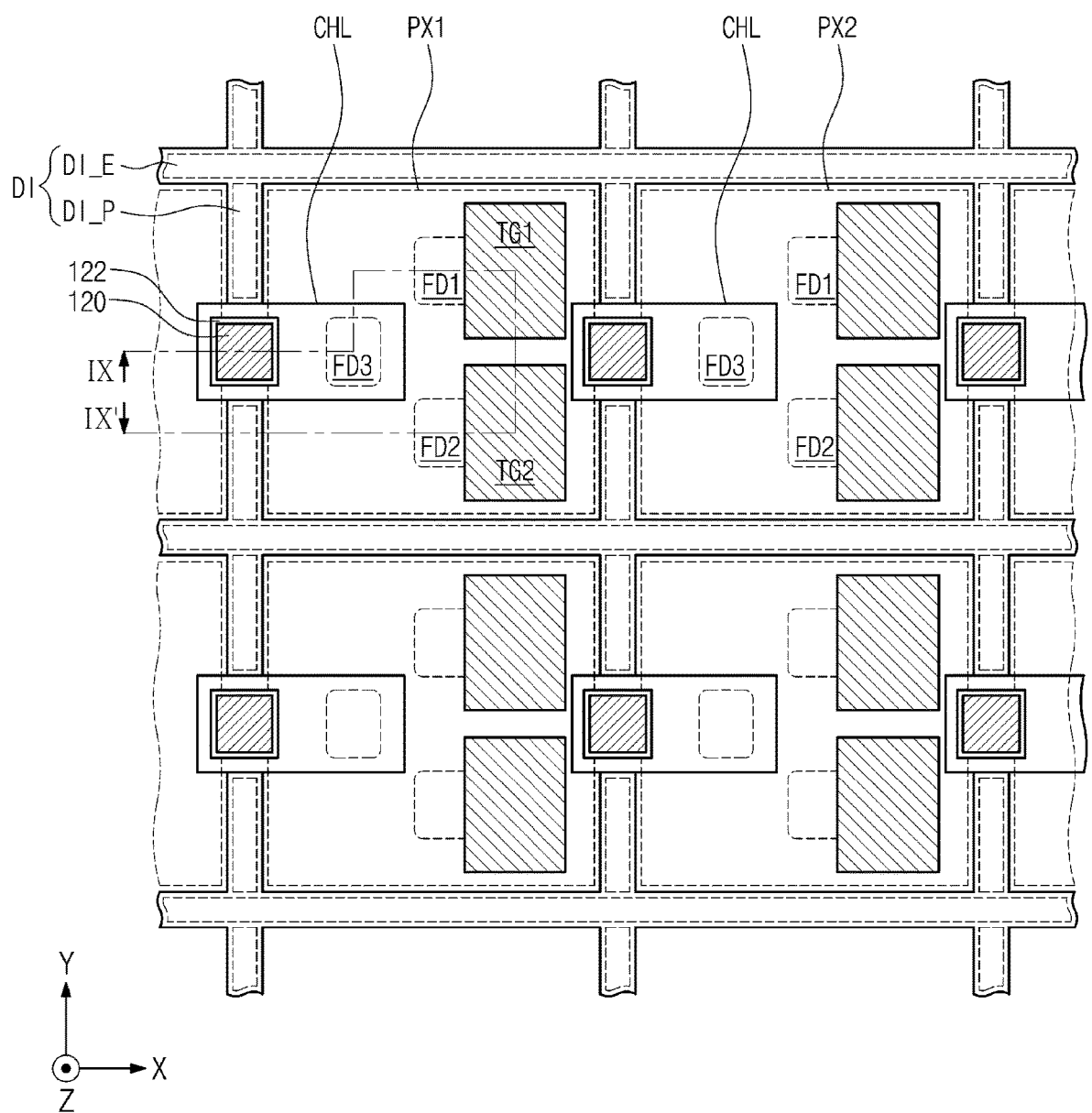
FIG. 19 illustrates a plan view of an image sensor according to embodiments of the inventive concepts.
Figure 20:
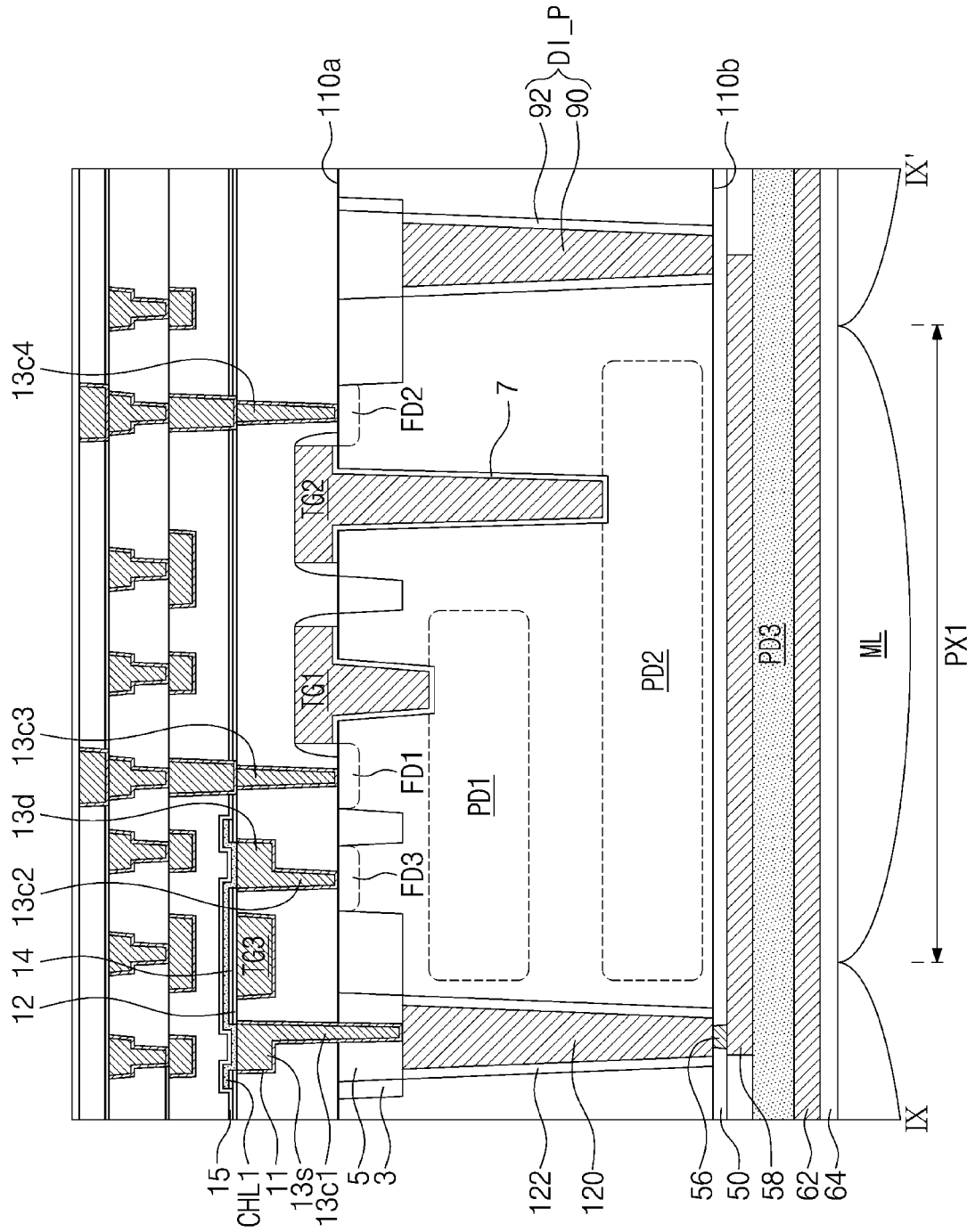
FIG. 20 illustrates a sectional view taken along a line IX-IX' of FIG. 19.

FIG. 19 illustrates a plan view of an image sensor according to embodiments of the inventive concepts. FIG. 20 illustrates a sectional view of the image sensor taken along a line IX-IX' of FIG. 19.

Referring to FIGS. 19 and 20, in the image sensor according to the present embodiment, each pixel PX1 or PX2 may be configured to obtain information on three different colors at the same time. In detail, the semiconductor substrate 110 includes the first surface 110a and the second surface 110b facing each other. The semiconductor substrate 110 may be doped with P-type impurities. In each pixel PX1 or PX2, the first photoelectric conversion part PD1 and the second photoelectric conversion part PD2 are disposed at different depths in the semiconductor substrate 110 and are vertically spaced apart from each other. The first and second photoelectric conversion parts PD1 and PD2 may be, for example, impurity regions that are doped with N-type impurities.

The deep device isolation part DI may be disposed in the semiconductor substrate 110 to separate the first pixel PX1 and the second pixel PX2 from each other. The deep device isolation part DI may include the extended portion DI_E which extends in the first direction X, and the protruding portions DI_P which protrude from the extended portion DI_E in the second direction Y crossing the first direction X or in the direction opposite to the second direction Y. The deep device isolation part DI may include a polysilicon pattern 90 and an insulating pattern 92. The through electrode 120, which is electrically disconnected from the polysilicon pattern 90, may be disposed in the semiconductor substrate 110.

In each pixel PX1 or PX2, the first transfer gate electrode TG1 and the second transfer gate electrode TG2, which are spaced apart from each other, are disposed on the first surface 110a of the semiconductor substrate 110. A portion of the first transfer gate electrode TG1 is extended into the semiconductor substrate 110 and is located adjacent to the first photoelectric conversion part PD1. A portion of the second transfer gate electrode TG2 is extended into the semiconductor substrate 110 and is located adjacent to the second photoelectric conversion part PD2. The second photoelectric conversion part PD2 may be deeper than the first photoelectric conversion part PD1, and a bottom surface of the second transfer gate electrode TG2 may be deeper than a bottom surface of the first transfer gate electrode TG1. The first gate insulating layer 7 is interposed between the first and second transfer gate electrodes TG1 and TG2 and the semiconductor substrate 110. The first floating diffusion region FD1 may be disposed in a region of the semiconductor substrate 110 adjacent to the first transfer gate electrode TG1. The second floating diffusion region FD2 may be disposed in another region of the semiconductor substrate 110 adjacent to the second gate electrode TG2.

The third floating diffusion region FD3, which is spaced apart from the first and second floating diffusion regions FD1 and FD2, may be disposed in the semiconductor substrate 110. The first surface 110a of the semiconductor substrate 110 is covered with the first interlayered insulating layer 9. The source electrode 13s, the third transfer gate electrode TG3, and the drain electrode 13d are disposed in the first interlayered insulating layer 9. The second gate insulating layer 14 and the channel pattern CHL are disposed on the third transfer gate electrode TG3.

In each pixel PX1 or PX2, a color filter is not disposed on the second surface 110b of the semiconductor substrate 110. The protection layer 50, the pixel electrode 58, the third photoelectric conversion part PD3, the common electrode 62, the second passivation layer 64, and the micro lens ML are sequentially stacked on the second surface 110b of the semiconductor substrate 110.

The first photoelectric conversion part PD1 may be configured to generate charges from light of a first wavelength. Such charges may be transferred to the first floating diffusion region FD1 by the first transfer gate electrode TG1.

The second photoelectric conversion part PD2 may be configured to generate charges from light of a second wavelength. Such charges may be transferred to the second floating diffusion region FD2 by the second transfer gate electrode TG2. Due to a difference in wavelength therebetween, the light of the first and second wavelengths may have different penetration depths in the semiconductor substrate 110. Thus, even though there is no color filter, the first photoelectric conversion part PD1 and the second photoelectric conversion part PD2 may sense light of different wavelengths.

The third photoelectric conversion part PD3 may be configured to generate charges from light of a third wavelength. Such charges may be transferred to the third floating diffusion region FD3 by the third transfer gate electrode TG3.

According to embodiments of the inventive concepts, an image sensor may include a separate transfer transistor, which is formed on an interlayered insulating layer and is used to transfer charges generated in an organic photoelectric conversion part. Thus, it may be possible to reduce reset noise and to increase charge transfer speed. In addition, it may be possible to provide a highly integrated image sensor capable of realizing improved image quality.

In a method of fabricating an image sensor according to embodiments of the inventive concepts, before a back-end-of-line (BEOL) process, a channel pattern may be formed using an oxide semiconductor material, and thus it may be possible to reduce or prevent contamination issues caused by the oxide semiconductor material, and consequent process failures, during the BEOL process.

While example embodiments of the inventive concepts have been particularly shown and described, it should be understood by one of ordinary skill in the art that variations in form and detail may be made therein without departing from the spirit and scope of the inventive concepts.

What is claimed is:

1. An image sensor, comprising:
a semiconductor substrate including a first surface, and a second surface opposite to the first surface;
a first photoelectric conversion part disposed adjacent to the semiconductor substrate on the second surface of the semiconductor substrate;
a first floating diffusion region provided in the semiconductor substrate adjacent to the first surface;
a first interlayered insulating layer covering the first surface;
a first channel pattern on the first interlayered insulating layer; and
a first transfer gate electrode disposed adjacent to the first channel pattern, the first transfer gate electrode configured to control transfer of charge generated in the first photoelectric conversion part to the first floating diffusion region through the first channel pattern.

2. The image sensor of claim 1, further comprising a through electrode disposed in the semiconductor substrate and that electrically connects the first photoelectric conversion part to the first channel pattern.

3. The image sensor of claim 2, further comprising:
a first contact plug that penetrates the first interlayered insulating layer and that connects the through electrode to an end of the first channel pattern; and
a second contact plug that penetrates the first interlayered insulating layer and that connects another end of the first channel pattern to the first floating diffusion region.

4. The image sensor of claim 3, further comprising:
a first conductive pattern facing the first contact plug, the first channel pattern interposed between the first conductive pattern and the first contact plug; and
a second conductive pattern facing the second contact plug, the first channel pattern interposed between the second conductive pattern and the second contact plug.

5. The image sensor of claim 4, wherein the first conductive pattern and the second conductive pattern are in contact with the first channel pattern.

6. The image sensor of claim 4, further comprising an insulating layer covering the first channel pattern,
wherein the insulating layer is interposed between the first conductive pattern and the first channel pattern, and between the second conductive pattern and the first channel pattern.

7. The image sensor of claim 1, wherein the first interlayered insulating layer comprises a recessed region, which is formed in an upper portion thereof, and
the first transfer gate electrode is disposed in the recessed region.

8. The image sensor of claim 1, further comprising:
a second photoelectric conversion part disposed in the semiconductor substrate; and
a second transfer gate electrode interposed between the first surface of the semiconductor substrate and the first interlayered insulating layer, the second transfer gate electrode configured to control transfer of charge generated in the second photoelectric conversion part.

9. The image sensor of claim 8, further comprising a second floating diffusion region disposed adjacent to the second transfer gate electrode and in the semiconductor substrate,
wherein the second floating diffusion region is spaced apart from the first floating diffusion region.

10. The image sensor of claim 8, further comprising:
a third photoelectric conversion part disposed in the semiconductor substrate and spaced apart from the second photoelectric conversion part; and
a third transfer gate electrode interposed between the first surface of the semiconductor substrate and the first interlayered insulating layer, the third transfer gate electrode configured to control transfer of charge generated in the third photoelectric conversion part,
wherein a depth of the second photoelectric conversion part is different than a depth of the third photoelectric conversion part,
a portion of the second transfer gate electrode and a portion of the third transfer gate electrode are extended into the semiconductor substrate, and
a depth of a bottom surface of the second transfer gate electrode is different than a depth of a bottom surface of the third transfer gate electrode.

11. The image sensor of claim 1, wherein the first transfer gate electrode faces the first interlayered insulating layer with the first channel pattern interposed therebetween, and
the image sensor further comprises a light-blocking pattern which vertically overlaps the first transfer gate electrode and that is interposed between the first channel pattern and the first interlayered insulating layer.

12. The image sensor of claim 11, wherein a width of the light-blocking pattern is larger than a width of the first transfer gate electrode.

13. The image sensor of claim 1, further comprising a second transfer gate electrode facing the first transfer gate electrode, with the first channel pattern interposed between the first transfer gate electrode and the second transfer gate electrode.

14. The image sensor of claim 13, wherein the first transfer gate electrode is located between the first channel pattern and the first interlayered insulating layer, and
a width of the first transfer gate electrode is larger than a width of the second transfer gate electrode.

15. The image sensor of claim 14, further comprising a metal-containing pattern interposed between the second transfer gate electrode and the first channel pattern,
wherein a width of the metal-containing pattern is larger than the width of the second transfer gate electrode.

16. The image sensor of claim 14, wherein the first transfer gate electrode includes a metal that is different than a metal included in the second transfer gate electrode.

17. The image sensor of claim 1, further comprising conductive patterns and at least one second interlayered insulating layer, wherein the conductive patterns and the at least one second interlayered insulating layer are interposed between the first interlayered insulating layer and the semiconductor substrate.

18. The image sensor of claim 1, further comprising:
a second photoelectric conversion part disposed on the first photoelectric conversion part;
a second channel pattern disposed on the first interlayered insulating layer and spaced apart from the first channel pattern;
a second floating diffusion region disposed in the semiconductor substrate adjacent to the first surface and spaced apart from the first floating diffusion region; and
a second transfer gate electrode disposed adjacent to the second channel pattern, the second transfer gate electrode configured to control transfer of charge generated in the second photoelectric conversion part to the second floating diffusion region through the second channel pattern.

19. The image sensor of claim 1, further comprising a color filter interposed between the first photoelectric conversion part and the semiconductor substrate.

20. An image sensor, comprising:
a semiconductor substrate including a first surface, and a second surface facing the first surface;
a photoelectric conversion part disposed adjacent to the semiconductor substrate on the second surface of the semiconductor substrate;
a floating diffusion region disposed in the semiconductor substrate adjacent to the first surface;
an interlayered insulating layer covering the first surface and comprising a recessed region on an upper portion of the interlayered insulating layer;
a channel pattern disposed on the interlayered insulating layer and overlapping the recessed region; and
a transfer gate electrode disposed in the recessed region, the transfer gate electrode configured to control transfer of charge generated in the photoelectric conversion part to the floating diffusion region through the channel pattern.

* * * * *